US008711023B2

(12) United States Patent
Guido et al.

(10) Patent No.: US 8,711,023 B2
(45) Date of Patent: Apr. 29, 2014

(54) ANALOG-TO-DIGITAL CONVERTER CONTROL USING SIGNAL OBJECTS

(75) Inventors: Samuel J. Guido, Dearborn, MI (US); Jeremy Brodt, Plano, TX (US); Jeff Sieber, Livonia, MI (US)

(73) Assignee: Renesas Electronics America, Inc., Santa Clara, CA (US)

( * ) Notice: Subject to any disclaimer, the term of this patent is extended or adjusted under 35 U.S.C. 154(b) by 1211 days.

(21) Appl. No.: 12/612,353

(22) Filed: Nov. 4, 2009

(65) Prior Publication Data

US 2011/0106415 A1 May 5, 2011

(51) Int. Cl.
*H03M 1/12* (2006.01)

(52) U.S. Cl.
USPC .......... 341/155; 341/144; 341/122; 341/158; 341/141

(58) Field of Classification Search
USPC .......... 341/141, 155, 159, 156, 162, 158, 122
See application file for complete search history.

(56) References Cited

U.S. PATENT DOCUMENTS

| | | | | |
|---|---|---|---|---|
| 5,331,324 | A * | 7/1994 | Nakajima | 341/141 |
| 5,757,416 | A | 5/1998 | Birch et al. | 348/6 |
| 6,507,298 | B1 | 1/2003 | Barrenscheen et al. | 341/141 |
| 6,788,240 | B2 | 9/2004 | Reyneri et al. | 341/159 |
| 7,061,942 | B2 | 6/2006 | Noronha, Jr. et al. | 370/537 |
| 2003/0001763 | A1 | 1/2003 | Uda | 341/141 |

* cited by examiner

*Primary Examiner* — Jean B Jeanglaude
(74) *Attorney, Agent, or Firm* — Campbell Stephenson LLP

(57) ABSTRACT

A method and apparatus for detecting an event and sampling first value from a pin in response to the event. For example, the event is identified by a signal object of a plurality of signal objects stored in a memory. Each signal object of the plurality of signal objects identifies a single analog input pin and a trigger.

20 Claims, 14 Drawing Sheets

ANALOG-TO-DIGITAL CONVERTER CONTROL USING SIGNAL OBJECTS

BACKGROUND

Modern control systems are growing in application and complexity. There are many classes of control systems, with many variations and combinations. Some control systems generate signals that control components of a device. For example, some automobile engine control systems generate signals that directly or indirectly control various components (e.g., spark plugs, fuel injectors, and the like) of an internal combustion engine. The present invention will be described with reference to an automobile engine control system, it being understood that the present invention should not be limited thereto.

The simplest engine control systems only control the timing and quantity of fuel injected into each cylinder during each cycle of the engine. More advanced engine control systems found in modern cars also control ignition timing, variable valve timing, the level of boost maintained by a turbo charger, etc. Using a complex set of algorithms, engine control systems can determine the quantity and timing of fuel injected into cylinders, ignition timing, and other needed parameters by monitoring the engine through sensors that include, for example, a manifold absolute pressure sensor, throttle position sensor, air temperature sensor, oxygen sensor, etc. In order to facilitate monitoring the sensors, the sensors' outputs should first be converted into digital values.

SUMMARY

A method and apparatus for detecting an event and sampling first value from a pin in response to the event. A plurality of signal objects is stored in a memory. Each signal object identifies a single analog input pin and a trigger.

BRIEF DESCRIPTION OF THE DRAWINGS

The present invention may be better understood in its numerous objects, features, and advantages made apparent to those skilled in the art by referencing the accompanying drawings. The use of the same reference symbols in different drawings indicates similar or identical items.

Figure 1:
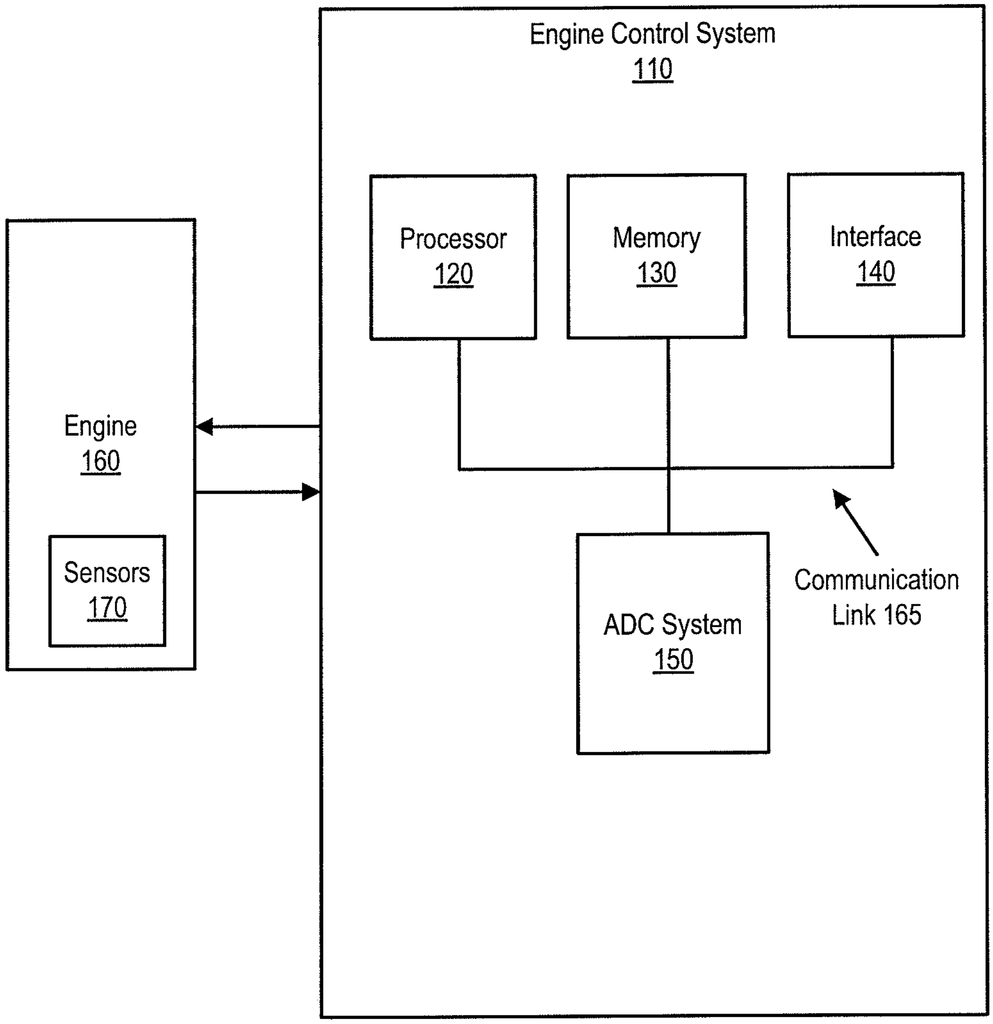
FIG. 1 is a block diagram that illustrates relevant components of an example engine control system, according to one embodiment.

While the invention is susceptible to various modifications and alternative forms, specific embodiments of the invention are provided as examples in the drawings and detailed description. It should be understood that the drawings and detailed description are not intended to limit the invention to the particular form disclosed. Instead, the intention is to cover all modifications, equivalents and alternatives falling within the spirit and scope of the invention as defined by the appended claims.

DETAILED DESCRIPTION

FIG. 1 is a block diagram that illustrates relevant components of an example engine control system 110. As illustrated, the engine control system includes one or more processors 120 (e.g., microprocessors, programmable logic devices (PLDs), or application specific integrated circuits (ASICs)) configured to execute program instructions stored in memory 130. Memory 130 can include various types of random access memory (RAM), read only memory (ROM), flash memory, micro electro-mechanical systems (MEMS) memory, magnetic core memory, and the like. Memory 130 can include both volatile and non-volatile memory. Engine control system 110 also includes one or more interfaces 140. Interface 140 can include a network interface to various networks and/or interfaces to various peripheral buses. Processor 120, memory 130, and interface 140 are coupled to send and receive data and control signals by communication link 165, which can include a bus, switching fabric, bridge, direct memory access controller, and the like. In one embodiment, the components of engine control system 110 can be integrated. In another embodiment, the components of engine control system can be implemented off-chip.

As illustrated, engine control system 110 also includes ADC system 150 (described below.) Engine control system 110 is shown coupled to an automobile engine 160. Engine 160 includes one or more sensors 170 that can be configured to detect various operational characteristics of engine 160, as described below.

In general, a control system (e.g., engine control system 110 of FIG. 1) is designed to regulate, or control some parameter (e.g., fuel/air mix ratio sent to an engine's cylinder). Typically the control system is designed to keep the value of the parameter at or near a given setpoint. In order for a control system to control a given parameter the control system typically monitors one or more "real-world" values. The value(s) monitored by the control system provides feedback as to how close to the given setpoint the parameter is. Based on the monitored value(s), the control system can detect and adjust operating characteristics of the controlled system. The effect of these adjustments can be detected by continuing to monitor the "real-world" value(s).

For example, engine control system 110 can monitor the output of one or more of sensors 170. Sensors 170 can include, for example, an oxygen sensor. An oxygen sensor can detect the amount of oxygen in engine 160's exhaust and produce an output voltage value that is proportional to the amount of oxygen detected. Engine control system 110 can detect whether the fuel/air mixture in one or more of engine 160's cylinders (not shown) is too lean or too rich based on the oxygen sensor's output voltage value. For example, engine control system 110 can indirectly compare the oxygen sensor's output voltage value with a predefined voltage value or range of voltage values that indicate an optimal fuel/air mixture ratio. If the oxygen sensor's output voltage value is above or below the optimal or target range, the mixture should be adjusted. Processor 120 can calculate a desired adjustment to the parameter and issue a command to engine 160 to adjust the parameter. If the oxygen sensor's output voltage value indicates that the fuel/air mixture is too lean or too rich, engine control system 110 can adjust the mixture, for example by signaling the fuel injection system (not shown) to increase or decrease the amount of fuel injected into the cylinder. By continuing to monitor the oxygen sensor's output voltage value, engine control system 110 can detect whether the adjustment has had the desired effect of bringing the oxygen sensor's output voltage value within the target range or if further adjustment to the mixture is required. While the oxygen sensor discussed in this example outputs a voltage, other types of sensors or sources may produce outputs that are measured in other terms, e.g., current.

A sensor's output voltage value (e.g., one of sensors 170) is typically an analog voltage value that can be transmitted to and measured at an analog input pin. Engine control system 110 can include a number of analog input pins from which engine control system 110 can read analog input values in order to detect a number of different engine performance characteristics. Reading an analog input value from an analog input pin is known as sampling the analog input value. The number of analog input pins available to the engine control system is typically quite limited. Adding additional analog input pins to an engine control system can be cost prohibitive or may be difficult or impossible due to limited engine control system resources (e.g., processor resources). Accordingly, there is great pressure to utilize the limited number of analog input pins as effectively as possible.

In order for engine control system 110 to use the "real world" information represented by the analog input values sampled from engine control system 110's analog input pins, the analog input values are typically converted to digital values that can more easily be manipulated by processors, such as processor 120 of FIG. 1. Engine control system 110 includes analog-to-digital converter (ADC) system 150 which can convert the sampled analog input values to digital values.

Figure 2:
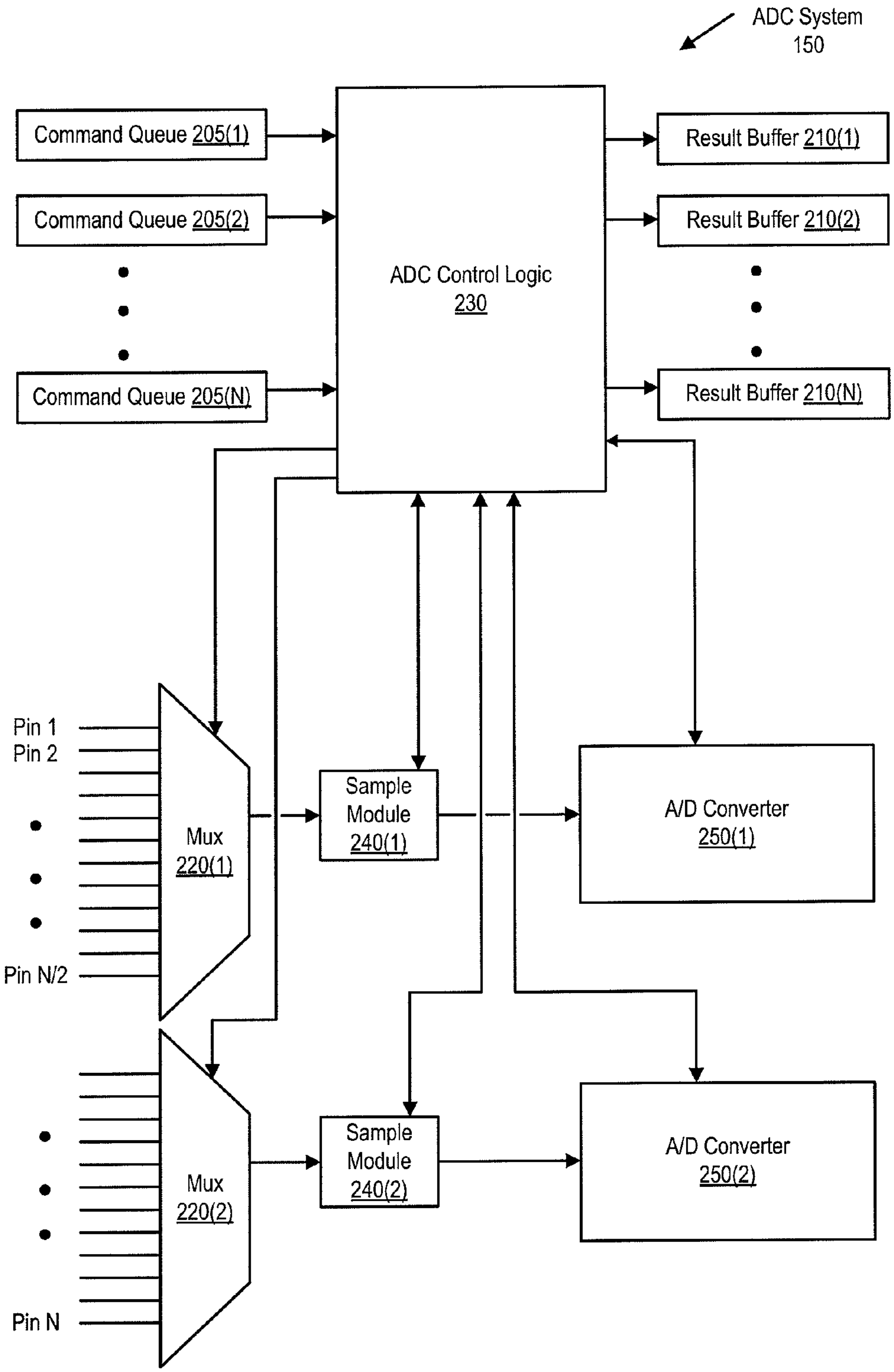
FIG. 2 is a block diagram that illustrates relevant components of an example analog-to-digital converter (ADC) system, according to one embodiment.

FIG. 2 is a block diagram that illustrates relevant components of an example ADC system, according to one embodiment. ADC system 150 includes one or more ADCs, such as ADCs 250. An ADC 250 can convert an analog value into a digital representation of that value. ADC system 150 also includes ADC control logic 230. ADC control logic 230 can control ADC 250s' conversion of an analog input value into a digital representation of that value. ADC system 150 receives analog input values on one or more analog input pins and then converts the analog input values into digital representations. The digital representations can be stored in result buffers 210. Result buffers 210 can be stored in memory, such as memory 130 of FIG. 1.

In one embodiment, sensors, such as sensors 170 of FIG. 1, produce output voltage values that are fed into ADC system 150 as analog input values. An analog input pin can be coupled to an output of a sensor or any other source for analog input values. For example, an analog input pin can be coupled to an oxygen sensor for an automobile engine, such as engine 160 of FIG. 1. The oxygen sensor can output an analog voltage value, for example, an analog voltage value between 0 and 5V. The analog voltage value output by the oxygen sensor is transmitted to an analog input pin coupled to the oxygen sensor, where the analog voltage value is known as an analog input value. In one embodiment, the analog voltage value output by the oxygen sensor can be amplified, for example by an amplifier (not shown), prior to arriving at an analog input pin. In one embodiment, a filter mechanism (not shown) can be included between the analog input pin and the oxygen sensor. A filter can be used, in one implementation, to protect sensitive analog input components from potentially damaging analog voltage value spikes. In another embodiment, a filter can remove noise from an analog input voltage produced by an oxygen sensor. The analog input value can change, i.e., the analog input value measured on an analog input pin at a first time may be different from the analog input value measured on the analog input pin at a second time. In the example of an analog input value supplied by an oxygen sensor, the analog input value varies proportionally with the level of oxygen detected by the oxygen sensor.

In an example case, the ADC system measures an analog input value of 2.52V on the analog input pin at a first time. In this example, the measurement of the analog input value is precise to two digits, or to a hundredth of a volt. If more precise measurements are desired, more sophisticated components (e.g., analog-to-digital converters and/or sensors) can be used. For example, if more sophisticated components are used for the above measurement, it may be seen that the analog input value is actually 2.5189V. For this example, 2.52V is used as the analog input value. If the ADC system measures an analog input value of 4.25V at a second time, the oxygen sensor detected more oxygen at the second time.

An analog input value can be converted to a digital representation by assigning the analog input value to one of a plurality of digital values available from an ADC converter. The number of possible digital values an ADC can assign is known as the ADC's resolution. For example, an 8-bit converter has $2^8$ (256) possible digital values. That is, an 8-bit ADC can assign 256 different digital values for the range of analog input values the ADC capable of handling. In one example, an ADC is capable of handling input values between 0 and 5V. The input voltage capability of an ADC is typically specified by the ADC's manufacturer.

Table 1 shows a mapping of analog input values between 0 and 5V to 8-bit digital values. In this example, an analog input value of 2.52V corresponds to an 8 bit digital value of 10000001. The higher an ADC's resolution, the more digital values that can be assigned over the same range of analog input values. For example, a 12-bit ADC can assign 4096 different (12 bit) digital values. It can be seen that higher resolution ADCs can provide greater precision in representing an analog input value with a digital values. Generally, ADCs with higher resolution are larger and more expensive.

TABLE 1

Mapping of analog input values to digital values for a typical 8-bit ADC.

| Analog Value | 8-bit Digital Value |
|---|---|
| 0 | 00000000 |
| 0.02 | 00000001 |
| 0.04 | 00000010 |
| 0.06 | 00000011 |
| • | • |
| • | • |
| • | • |
| 2.5 | 10000000 |
| 2.52 | 10000001 |
| 2.54 | 10000010 |
| • | • |
| • | • |
| • | • |
| 4.96 | 11111101 |
| 4.98 | 11111110 |
| 5 | 11111111 |

An ADC system (such as ADC system 150 of FIG. 2) can include multiple ADCs and concurrently receive analog input values from multiple sources or sensors. Each ADC in an ADC system can convert one analog input value to a digital value at a time. Ensuring that analog input values from all of a control system's analog input pins are sampled and converted in a timely manner is a primary objective in the design of an ADC system and can be a significant challenge.

One way ADC system designers can attempt to meet this challenge involves logically grouping analog input pins. Grouping an ADC system's analog input pins allows designers to specify a single set of conversion parameters that apply to all the analog input pins in a group. Grouping an ADC system's analog input pins effectively (in order to maximize ADC system resource utilization) can be an intricate task. Designers spend significant time and effort determining how to group an ADC system's analog input pins. Factors to consider when grouping an ADC system's analog input pins include the number of analog input pins in the ADC system, the number of ADCs in the ADC system, and the ADC bandwidth requirements for each analog input pin (e.g., how frequently analog input values must be sampled from each analog input pin), as well as other conversion configuration parameters for each analog input pin (e.g., the priority and the trigger mechanism of each analog input pin).

Some ADC systems provide one or more command queues, such as command queue 205 of FIG. 2, for each group of analog input pins. A command queue specifies conversion configuration parameters (described below) for its group of analog input pins. Each analog input pin in the group is subject to the conversion configuration parameters specified by the command queue. Grouping the analog input pins in this way means that system designers can specify fewer sets of conversion configuration parameters. Instead of having to designate a set of conversion configuration parameters for each of an ADC system's analog input pins, designers need only designate a set of a set of conversion configuration parameters for each of the ADC system's command queues. Usually there are significantly fewer command queues than analog input pins.

Figure 3:
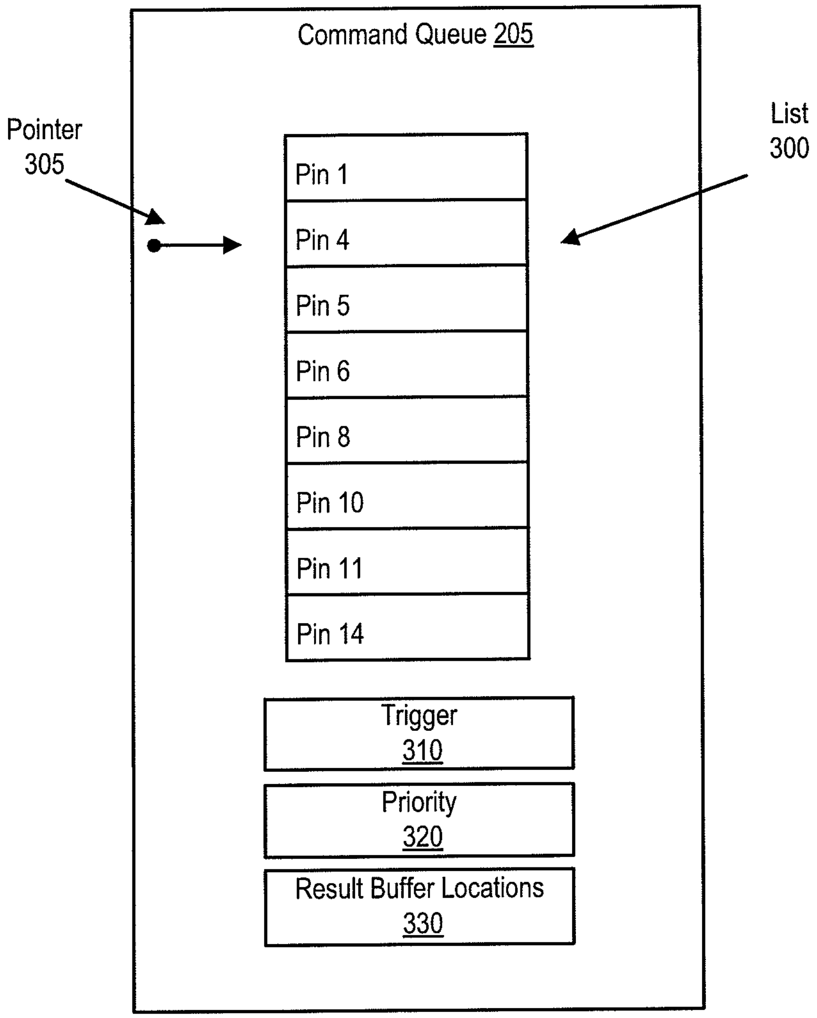
FIG. 3 is a block diagram that illustrates relevant components of an example command queue, according to one embodiment.

FIG. 3 is a block diagram that illustrates relevant components of an example command queue, according to one embodiment. A command queue, such as command queue 205 of FIG. 3, identifies one or more analog input pins and conversion configuration parameters that apply to the analog input pins. For example, a command queue can identify the analog input pins by including a list of analog input pins, such as list 300 of FIG. 3. Examples of conversion configuration parameters that can be identified by a command queue include a trigger, such as trigger 310 of FIG. 3, a priority, such as priority 320 of FIG. 3, and the location of one or more result buffers, such as result buffer locations 330 of FIG. 3.

A trigger, such as trigger 310 of FIG. 3, can be used to signify when an analog input value from one or more analog input pins should be sampled. ADC control logic initiates sampling on the occurrence of a trigger. A trigger can be periodic (i.e., the trigger occurs on a periodic basis). In other embodiments, a trigger can be a one time trigger, an event-driven trigger, or other type of non-periodic trigger. A periodic trigger can occur, for example, when a certain time period expires. In one embodiment, the trigger occurs based on an output value of a sequential counter. In one example, the counter increments by 1 with each cycle or half cycle of a square wave clock signal input. The counter begins at 0 and increments by 1 with each full or half clock cycle until the counter reaches a predetermined value (e.g., 0xFFFF). Thereafter the counter returns to 0 and continues incrementing. It is noted that the clock signal used by the counter may be a system clock provided to and used by each of the components of ADC system 110, shown in FIG. 2. In one embodiment, a trigger can be programmed to occur each time the value of the counter reaches, for example, 0xFF00. The time period of the trigger can be calculated as a time value by multiplying the value of the counter at which the trigger specifies a sample by the length of time in each clock cycle. For example, if the clock frequency is 1 MHz, a trigger set to initiate a sample when the counter reaches 0xFF00 initiates a sample approximately every 65 milliseconds. Multiple periodic triggers can be configured to occur at multiple values of the sequential counter. For example, in addition to programming a trigger to occur when the counter reaches 0xFF00, additional triggers can be programmed to occur at other values of the counter, e.g., every 50 increments of the counter.

In another embodiment, a trigger can occur when a certain engine rotation angle occurs. An engine rotation angle relates to an angular position of an engine cycle at a given time and can be generated as a function of a variable reluctance sensor (not shown) output. A number of equally-spaced and equally-sized teeth are formed around a crankshaft flywheel (not shown); two (or more) of the teeth, however, have a different distance between them. A sensor is located in proximity and senses the teeth as they pass. A processor (such as processor 120 of FIG. 1) generates a predetermined number of "ticks" between sensed teeth based on the sensor output. These ticks may have a resolution of 0.1 degree, 0.25 degree, 0.5 degree, etc., of crankshaft rotation. When a tooth is sensed, the period from the just previously sensed tooth is used to generate ticks for the currently sensed tooth. Since acceleration and deceleration of the crankshaft can cause a tooth period to be longer or shorter than the previous tooth period, the processer ensures the correct number of ticks is produced for each tooth. This is done by incrementing ticks quickly or by stopping them until the next tooth is sensed. The two teeth that have a different distance between them, as noted above, are used as a reference point to identify a full rotation of the crankshaft.

The ticks are provided to an angle reference value generator (not shown) that generates an angle reference value. The angle reference value generator increments by 1 for each tick until the counter reaches a predetermined value (e.g., 0xFFFF). Thereafter the counter returns to 0 and continues incrementing. When the crankshaft speed of rotation increases or decreases, the rate at which the reference value increments increases or decreases proportionally. To illustrate, assume the crankshaft rotates at a faster speed during a first time period when compared to a second time period. During the first time period, the reference value increments at a rate that is greater than the rate at which it increments during the second time period. A trigger can be programmed to initiate a sample of one of the pins listed in a command queue based on the reference value, or based on the value of the counter. For example, a trigger can occur each time the counter reaches, for example, 0xFF00. In this example, the period (in degrees) of the trigger can be calculated by multiplying the value of the counter at which the trigger specifies a sample by the resolution of the ticks. For example, if the resolution of the ticks is 1 tick per 0.5 degree of crankshaft rotation, a trigger set to occur when the counter reaches 0xFF00 does so every 32640 degrees of crankshaft rotation, or approximately every 90 rotations of the crankshaft.

An event driven trigger is a trigger that is configured to occur if a specific event is detected. For example, a trigger can be configured to occur if current in a coil (e.g., a charging coil that provides energy used by a spark plug for creating a spark within an engine cylinder) exceeds a threshold value. The value of coil current can be detected by a coil current sensor in the engine.

A command queue's trigger determines when analog input values are sampled from each analog input pin listed in the command queue. The frequency at which sampling is initiated for each analog input pin is known as the analog input pin's sample rate. Sample rate depends on the frequency of the occurrence of the command queue's trigger.

ADC control logic, such as ADC control logic 230 of FIG. 2, can determine which analog input value to process (sample and convert), if analog input values from analog input pins identified by more than one command queue require sampling concurrently. ADC control logic can use the priorities of the respective command queues to determine the order in which to sample analog input values. For example, if the trigger for a first command queue occurs simultaneously with the trigger for a second command queue, an analog input value should be sampled and converted from an analog input pin identified in each of the first and second command queues. If insufficient ADC bandwidth exists at the time to convert both analog input values simultaneously, ADC control logic must determine which of the command queues has a higher priority. In an ADC system having only one ADC and one sample module, only one analog input value at a time can be processed (sampled and converted). In this case, ADC control logic determines which of the two command queues has a higher priority. An analog input value from an analog input pin of the command queue with the higher priority is processed first.

Command queue 205, as illustrated in FIG. 3, also includes a pointer 305. Pointer 305 points to an analog input pin in list 300 from which ADC system 150 will next sample an analog input value. Each time a trigger associated with command queue 205 occurs, ADC control logic 230 initiates a sample of the first analog input pin included in list 300 and updates pointer 305 to point to the next analog input pin identified in list 300. Once the first analog input pin is sampled, the next analog input pin identified in list 300 is sampled and ADC control logic again updates pointer 305 to point to the next analog input pin identified in list 300, and so on until each pin identified in list 300 has been sampled. At that point, control logic 230 updates pointer 305 to point to the first analog input pin identified in list 300. When a trigger associated with command queue 205 occurs again, the process described above can be repeated.

As illustrated, ADC system 150 of FIG. 2 includes two multiplexers 220, two sample modules 240, and two ADCs 250. It is noted that in other embodiments, ADC system 150 may include more or fewer multiplexers, sample modules, and ADCs. Sample modules 240 can read (sample) an analog input value from the ADC system's analog input pins and can also store a sampled analog input value. In response to a trigger occurring, one of sample modules 240 can sample an analog input value from one of the analog input pins identified in a command queue 205. Once one of sample modules 240 samples the analog input value is sampled, the sample module can store the analog input value. An ADC 250 can read the analog input value from the sample module 240 and convert the analog input value to a digital value.

Typically ADC control logic 230 of FIG. 2 initiates a sampling in response to the occurrence of a trigger, such as trigger 310 of FIG. 3. Initiation of a sampling can include selecting an analog input pin based on the position of command queue pointer 305 of FIG. 3, relative to the list of analog input pins 300 of FIG. 3. Once ADC control logic 230 has selected an analog input pin, ADC control logic 230 can send a control signal to the control input of a multiplexer, such as one of multiplexers 220 of FIG. 2. Multiplexers 220 are shown having inputs 1 through N. It will be noted that the variable identifier "N" is used to more simply designate the final element (e.g., input N) of a series of related or similar elements. The repeated use of such variable identifiers is not meant to imply a correlation between the sizes of such series of elements, although such correlation may exist. The use of such variable identifiers does not require that each series of elements has the same number of elements as another series delimited by the same variable identifier. Rather, in each instance of use, the variable identified by "N" may hold the same or a different value than other instances of the same variable identifier.

Based on a control signal received from ADC control logic 230, a multiplexer 220 can select one of the analog input pins 1 through N connected to the inputs of the multiplexer 220. For example, if a command queue pointer indicates (e.g., by pointing to the analog input pin the command queue list of analog input pins) that the next analog input pin from which an analog input value is to be sampled from is the third pin of an 8-input multiplexer, ADC control logic can send a control signal that corresponds to the third pin to the multiplexer. Table 2 shows one example of control signals and corresponding input selections for an 8-input multiplexer. Generally, more control signal bits are required for multiplexers having more input pins. For example, a system having between 33 and 64 inputs would require 6 bits of control input to select one of the input pins, while a system having between 17 and 32 input pins would only require 5 bits of control signal to select one of the input pins. Once the multiplexer receives a control signal selecting one of the analog input pins, the multiplexer can pass an analog input value from the selected analog input pin to the output of the multiplexer.

TABLE 2

| Multiplexer input selections. | |
|---|---|
| Control | Pin |
| 000 | 0 |
| 001 | 1 |
| 010 | 2 |
| 011 | 3 |
| 100 | 4 |
| 101 | 5 |
| 110 | 6 |
| 111 | 7 |

As illustrated in FIG. 2, the output of a multiplexer 220 is connected to sample module 240. Sample module 240 is coupled to ADC control logic 230 and to an ADC 250. The sample module 240 stores a sampled analog input value until ADC 250 converts the analog input value to a digital value. At that point, the sample module 240 transmits the analog input value to the input of the ADC 250, which is shown coupled to sample module 240, can read an analog input value from sample module 240 and convert the analog input value to a digital value.

The sequence of steps to convert an analog input value can include some or all of the following: a command queue's trigger occurs; ADC control logic determines from which of the analog input pins listed in the command queue an analog input value is to be read; ADC control logic sends a control signal to a multiplexer to select the analog input pin; the multiplexer passes an analog input value from the selected analog input pin to the sample module; an ADC reads the analog input value from the sample module; the ADC converts the analog input value to a digital value; the ADC transmits the digital value to a result buffer and transmits a conversion complete signal to the ADC control logic.

Grouping analog input pins into a list where analog input values from each analog input pin in the list are sampled based on the same trigger has a number of potential drawbacks. One problem that can arise is when an analog input signal on an analog input pin requires a sample rate that is not provided by any of the ADC system's command queues. In the case in which none of the ADC system's command queues specifies a sample rate that is identical to the needed sample rate, the analog input pin must be listed in a command queue that has a sample rate that is either faster or slower than the needed sample rate.

For example, consider a system that has two command queues, a first of which identifies a trigger that occurs every 50 milliseconds. Every 50 milliseconds, a process of sampling an analog input value from each of command queue's analog input pins (sequentially) is initiated. The second command queue identifies a trigger that occurs every 200 milliseconds. If an analog input pin in the ADC system requires a sample rate of 100 milliseconds (i.e., an analog input value must be sampled from the analog input pin every 100 milliseconds), a determination must be made which command queue to list the analog input pin in. The analog input pin must be listed in either the command queue with the 50 millisecond sample rate or in the command queue with the 200 millisecond sample rate if the ADC system of FIG. 1 does not allow specifying a trigger for each individual analog input pin.

In the ADC system of FIG. 2, each analog input pin must be identified in at least one of the ADC system's command queues. Thus all analog input pins have a sample rate that is a function of the frequency of occurrence of the trigger of the command queue in which the analog input pin is listed. If the analog input pin with the desired sample rate of 1 sample per 100 milliseconds is listed in the first queue, an analog input value will be sampled from the analog input pin more frequently than is needed. This extra sampling is an unnecessary burden on the engine control system and reduces the efficiency of the engine control system by using resources to sample analog input values from an analog input pin at times when the analog input values do not need to be sampled. This extra sampling also results in wasted ADC bandwidth in the form of unnecessary conversions. If, on the other hand, the analog input pin is listed in the second queue, analog values will be sampled from the analog input pin too infrequently and important analog input values are not sampled from the analog input pin.

Another problem that can result from grouping analog input pins into command queues, as in the ADC system of FIG. 2, is evident when considering composite signals. A composite signal is a type of analog input signal. A composite signal includes multiple source signals that create a single analog waveform on a single analog input pin. For example, the multiple source signals can each be present on the analog input pin at separate times. Thus, multiple source signals are time multiplexed onto a single analog input pin. A source signal refers to an analog input signal generated by a sensor (e.g., an oxygen sensor) or the like. A source signal is made up of the analog output values from a sensor. An analog input signal can consist of a single source signal. Alternatively, an analog input signal can consist of multiple source signals. In the latter case, the analog input signal is known as a composite signal. In one embodiment, a single sensor output can include multiple signals of interest. The multiple signals of interest can be made available on a single analog input pin as a composite signal or coupled to multiple analog input pins.

The term analog input signal, when used in the context of analog-to-digital conversion, is used to refer to an analog waveform that can be produced by sampling two or more output values of a sensor. The sensor output values are available to be sampled as analog input values at an analog input pin. An analog input signal can be represented graphically by plotting several sampled analog input values over time. That is, several sampled analog input values are plotted on the vertical axis of a graph and the times at which the analog input values were sampled are plotted on the horizontal axis of the graph.

One example of an analog input signal is a knock signal. An engine control system, such as engine control system 110 of FIG. 1, can detect engine knock by monitoring a knock signal. Engine knock refers to premature detonation of engine fuel ahead of the normally scheduled combustion that occurs in an engine's combustion chamber (e.g., cylinder). An engine typically has a knock sensor to detect such premature detonation. The knock sensor outputs different voltage levels when the engine is knocking from when the engine is not knocking. The knock sensor output can include a specific characteristic frequency, observable when the engine is knocking, but not when the engine is not knocking. The voltage produced by the knock sensor is available on a given analog input pin, allowing the observation of a knock signal on the given analog input pin.

By sampling analog input values from the given analog input pin during a particular period of time, an engine control system can detect whether the engine is knocking. In order to detect engine knock, the engine control system can convert the analog input signal (knock signal) to a series of digital values. These digital values can be analyzed by a processor which detects whether the engine is knocking. If the engine control system detects that the engine is knocking, the engine control system can adjust various engine parameters (e.g., ignition timing, fuel injection) to alleviate the knocking.

Figure 4:
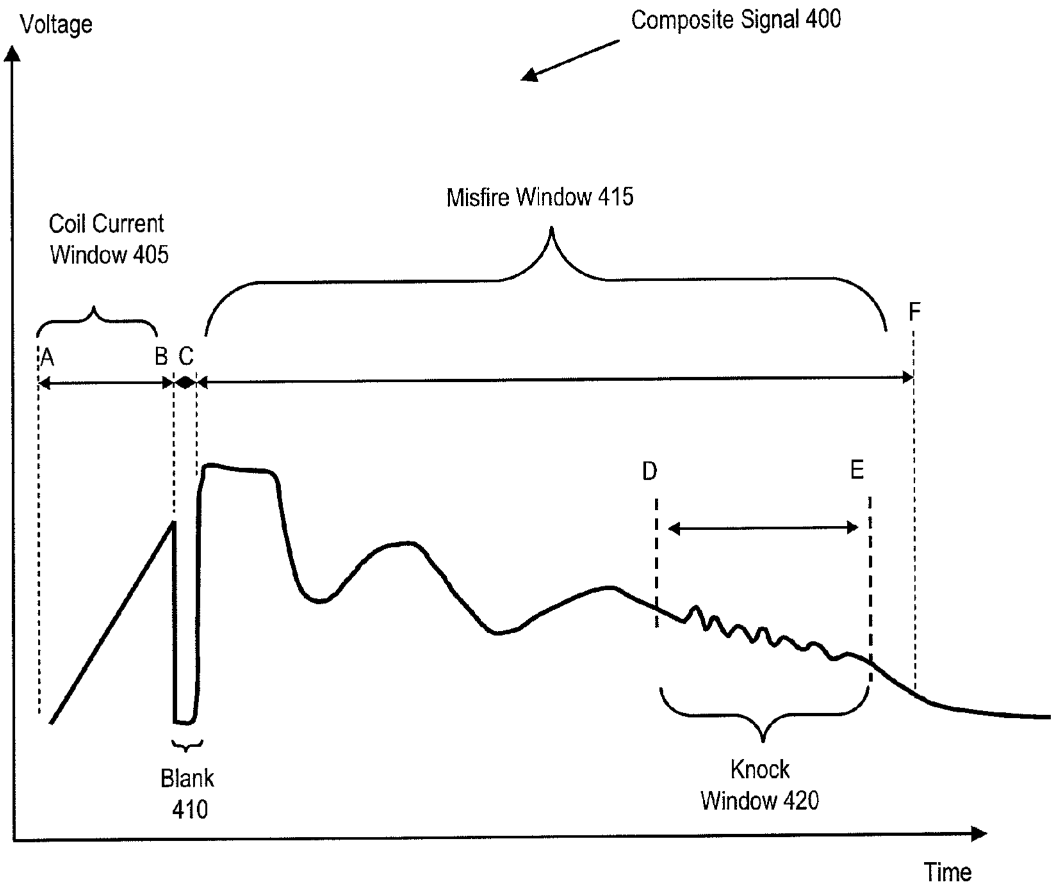
FIG. 4 illustrates relevant components of an example composite signal, according to one embodiment.

FIG. 4 illustrates relevant components of an example composite signal, according to one embodiment. Composite signal 400 includes information about coil current, knock, and misfire (misfire refers to the failure of fuel to properly ignite in an engine's combustion chamber). Multiple source signals can be made available on a single analog input pin by coupling multiple sensors to a single analog input pin. The output of each sensor is time multiplexed onto the analog input pin for a specified window of time. For example, during a first window of time, the output of a first sensor can be coupled to the analog input pin. During a second window of time, the output of the first sensor can be disconnected from the analog input pin and the output of a second sensor can be coupled to the analog input pin. In one embodiment, multiple source signals can be generated by a single sensor. For example, a single sensor can generate a knock signal during one window of time and a misfire signal during another window of time. One reason to include multiple source signals on one analog input pin is to allow more source signals to be monitored on fewer analog input pins. Engine control systems are limited in the number of analog input pins that are available. Adding more analog input pins can require expensive system redesign and is not feasible above a certain number.

Decomposition of a composite signal refers to a process of extracting the various pieces of information from the composite signal, or separating the multiple source signals that form the composite signal. Once the various source signals are separated, the engine control system can use the source signals to control various engine operating characteristics. FIG. 4 illustrates a coil current window 405, misfire window 415, knock window 420, and a blank period 410. Source signals corresponding to the respective windows are available on an analog input pin during the respective windows. For example, during the coil current window, a coil current source signal is available on the analog input pin. Any other sensors coupled to the analog input pin are blocked from transmitting analog input values onto the analog input pin during the coil current window. During the blank period, no source signal is available on the analog input pin.

In the example of FIG. 4, decomposing composite signal 400 involves separating the coil current, misfire, and knock signals from one another. The ADC system of FIG. 2 is not designed to effectively decompose composite signals. In order to decompose a composite signal, the ADC system of FIG. 2 may be required to sample at higher than necessary rates, perform extensive sorting of conversion result data, and use additional analog input pins, all of which are burdens on processing and memory resources of an engine control system.

The ADC system of FIG. 2 provides only one trigger for each command queue. Each analog input pin listed in the command queue has the same trigger, i.e., the command queue's trigger, and the command queue's trigger indicates when analog input values are sampled from each analog input pin listed in the command queue. A trigger can include information that specifies when an analog input value should be sampled from an analog input pin listed in the command queue, such as frequency parameters (e.g., sample an analog input value from an analog input pin every 10 milliseconds) and event parameters (e.g., sample an analog input value from an analog input pin 100 microseconds after the engine control system detects coil current exceeds a predetermined threshold value). Analog input values are sampled from each analog input pin listed in the command queue according to the trigger configuration information for the command queue.

In the case of a composite signal, which is composed of multiple source signals (which can be generated either by a single sensor or multiple sensors), a command queue's limitation of only one trigger can lead to inefficient use of ADC resources when attempting to decompose the composite signal. For example, a higher sample rate may be required for one of the source signals of the composite signal than the sample rate required for other source signals of the composite signal. If a command queue's trigger specifies a sample rate fast enough to capture the required data for the source signal having the higher rate, the sample rate will be higher than is needed for other source signals. This leads to over sampling, or sampling (and converting) of analog input values at times when no sampling is actually desired.

For example, during the knock window 420 of FIG. 4, the sample rate is required to be relatively high (e.g. 100-200 kilohertz) because frequent samples are required to determine if the engine is knocking. During the misfire window 415 of FIG. 4, less frequent sampling is required (e.g. 10-20 kilohertz) because misfire can be detected with less frequent sampling. However, since the ADC system of FIG. 2 only specifies one sample rate per analog input pin, or one trigger configuration per command queue, the ADC system of FIG. 2 is unable to adjust for this difference. The ADC system of FIG. 2 lacks the capability of specifying multiple sample rates for a given analog input pin listed in a command queue. Thus, if the sample rate is high enough to capture all the required analog input values during the knock window, the sample rate is unnecessarily high during the misfire window, resulting in unneeded samples. The ADC system requires more memory to store all these unneeded samples as well as faster, more expensive ADCs to convert the extra samples. The inability to specify multiple sample rates for a given analog input pin results in a less efficient system overall.

In the ADC system of FIG. 2, each command queue includes a list of memory location addresses. Each address identifies a location in memory where conversion results are stored. These memory locations are known as the ADC system's result buffers. For each analog input pin listed in the command queue, there is a corresponding memory location (result buffer) address listed in the command queue. Once a given analog input pin is sampled, and the analog input value converted to a digital value by an ADC, the digital value is stored in the result buffer that corresponds to the given analog input pin. An engine control system processor can read the digital value from the result buffer and process the digital value in performing engine system control functions. For example, if an analog input value is to be sampled from an analog input pin every millisecond for 1.5 seconds, the result buffers will store 1500 digital values, each digital value being the digital representation of the analog value present on that analog input pin at each millisecond during the 1.5 second interval.

One consequence of the ADC system of FIG. 2 having only a single configuration for each analog input pin is that the conversion results for that analog input pin (digital representations produced by an ADC of the sampled analog input values) are sent to the same result buffer, i.e., the result buffer that corresponds to the analog input pin, as specified by the command queue's list of memory location addresses. In the case of a composite signal, the engine control system is required to sort out the conversion results that correspond to the individual source signals so that the results for each individual source signal can be used by the various portions of the engine control system. For example, if knock and misfire analog input values are sampled from the same analog input pin, the digital values corresponding to the knock and misfire signals will both be stored in that analog input pin's result buffer. The engine control system must separate the knock sensor values from the misfire sensor values so that only knock sensor data is used when determining whether the engine is knocking. If the engine control system attempted to use the conversion results without first separating the various signal results, the results could be unpredictable. For example, using knock signal data mixed with misfire data to determine if the engine was knocking could result in errors and ineffective engine control by the engine control system.

Also, as noted above, if the ADC system sampled at too high a rate during the misfire window, some of the misfire conversion results are not needed and must be discarded. Separating the conversion results for various source signals and determining which results are needed and which should be discarded is known as post-processing. Post-processing can include a processor, such as processor 120 of FIG. 1, in the engine control system determining when the analog input values corresponding to each digital value were sampled by analyzing the trigger configuration of the command queue associated with the result buffer. The processor can then select digital values that correspond to analog input values that were sampled during the relevant time periods (e.g., during the knock window). Once the locations in the result buffer that store conversion results for each of the various signals are identified, the conversion results can be transferred from those locations to other parts of the engine control system for use in controlling the engine. For example, the knock signal conversion results can be evaluated by the engine control system, and if a knock condition is detected, the engine control system can adjust engine parameters to attempt to alleviate the knocking.

Post-processing is a burden on engine control system processing resources and can reduce the speed and efficiency of the engine control system. When the processor needs to use, for example, knock sensor data, the processor in this embodiment cannot simply go to a knock sensor data result buffer and read the values in the result buffer. In the embodiment illustrated in FIGS. 2 and 3, there is not a result buffer that exclusively contains data for each signal. Instead, result buffers have conversion results from multiple signals mixed together. As a result, the processor must spend cycles locating the desired data, which can delay the processor's performance of other tasks.

In some cases, a composite signal may be routed to more than one analog input pin in an attempt to mitigate some of the issues discussed above. The analog input pins to which the composite signal is routed can be included in different command queues, the different command queues having different triggers and different result buffers. Listing the composite signal's analog input pin in multiple command queues alleviates the problem of sampling at a single rate for multiple signals on a single analog input pin by providing multiple sample rates for the analog input pins.

Consider a composite signal composed of two source signals. A first source signal of the composite signals requires conversion at a first sample rate. A second source signal of the composite signal requires conversion at a second sample rate. The composite signal can be routed to two analog input pins listed in different command queues from each other. The first command queue (the command queue that lists a first of the two analog input pins) has a trigger that initiates samples of analog input values from one of the analog input pin to which the composite signal is routed at the first sample rate. When the first command queue's trigger occurs, an analog input value is sampled from the analog input pin listed in the first command queue. The sampled analog input value is converted to a digital value and stored in the result buffer specified by the first command queue. The second command queue has a trigger that initiates samples of the other analog input pin to which the composite signal is routed at the second sample rate. When the second command queue's trigger occurs, an analog input value is sampled from the analog input pin listed in the second command queue. The sampled analog input value is converted to a digital value and stored in the result buffer specified by the second command queue. In this way the same composite signal is sampled at two different sample rates and the conversion results stored in two different result buffers.

An engine control system processor can read the digital values from the result buffers. Since the digital values in each result buffer result from samples of the composite signal, the digital values in each result buffer represent conversion results for two source signals. The processor needs to separate the conversion results for the first source signal from the conversions results for the second source signal, so that the results can be used to control various engine parameters. In order to determine which conversion results correspond to the first source signal and which conversion results correspond to the second source signal, the processor can detect the time during which the analog input values that produced the conversion results were sampled. For example, if the first source signal of the composite signal is only valid between a first time and a second time, the processor can select conversion results stored in the first result buffer that correspond to analog input values sampled from the analog input pin between the first and second times. If the second signal is valid only between a third time to a fourth time, the processor can select conversion results stored in the second result buffer that correspond to analog input values sampled from the analog input pin between the third and fourth times.

In this way, the first source signal is sampled at the sample rate desired for the first source signal and the second source signal is sampled at the sample rate desired for the second source signal. Having two or more sample rates for a composite signal alleviates the problem of sampling too frequently or too infrequently for at least one source signal of a composite signal where the multiple source signals require different sample rates. However, in order to specify multiple sample rates, the ADC system of FIG. 2 must use multiple analog input pins and multiple result buffers. This additional use of resources is undesirable since the memory and number of analog input pins is limited in most ADC systems.

Furthermore, the processor is required to differentiate between the conversion results in each result buffer that correspond to the analog input values for the source signal being captured by the command queue corresponding to each result buffer since each result buffer will also contain data for all of the source signals. This need to determine which conversion results correspond to which source signal is an additional processing burden on the processor, which also has limited processing resources available.

Adding additional analog input pins, memory, and processing power to an ADC system is expensive and can require physically reconfiguring the ADC system (e.g., fabricating a revised printed circuit board (PCB) on which the analog input signals are routed). The "costs" discussed above (of sampling at too high or too low a rate and post-processing) must be weighed against the undesirability of appropriating more than one analog input pin for one (composite) analog input signal and the associated memory and processing costs.

The ADC system of FIG. 2 is also relatively inflexible in regard to changes to an analog input signal's requirements. For example, the required sample rate can change as a result of a manufacturer's design change, or as a consequence of field test results. For example, an auto manufacturer can decide, for any of a variety of reasons, that in future designs of an engine, a given signal should be sampled at a different rate than in prior engines. Or, for example, an engine service center can detect that a sample rate specified by engine control system designers is insufficient for detection of certain engine conditions (e.g., specified sample rate for a knock signal is too low to detect engine knocking).

If the required sample rate for a given analog input pin changes, the ADC system of FIG. 2 must either change the sample rate for the command queue that lists that analog input pin or include the analog input pin in a different command queue. The ADC system can change a command queue's sample rate, for example, by specifying a different trigger that occurs more frequently or less frequently than the previously specified trigger. However, changing the sample rate for a command queue affects all analog input pins listed in the command queue, which may have unwanted effects, such as sampling analog input values too often in the case of some analog input pins or too infrequently in the case of other analog input pins. Rerouting an analog input signal to a different analog input pin requires physical reconfiguration (e.g., severing traces and adding wires on a PCB). Furthermore, including the analog input pin in a different command queue may be difficult or impossible. In order to include the analog input pin in a different command queue, an engine control system designer must determine if any command queues are available to accept additional analog input pins, and select a command queue, if one is available, that specifies a sample rate that meets the required sample rate for the analog input pin being moved. If a suitable queue is available, the designer must add the analog input pin to the command queue's list of analog input pins and remove the analog input pin from the list in the command queue which previously listed the analog input pin. All of these operations add cost to and/or reduce the efficiency of the ADC system.

Another limitation of the ADC system of FIG. 2 concerns priority management for the ADC system's analog input pins. The ADC system of FIG. 2 has multiple command queues and multiple ADCs. Each command queue has an associated priority. The priority of each command queue affects the order in which sampled analog input values from analog input pins listed in each command queue are converted to digital values by the ADC system's ADCs. When a command queue's trigger occurs, the command queue sends a conversion request to ADC control logic. The conversion request can take the form of the command queue sending a message to ADC control logic. In one embodiment, the command queue can set a flag that is periodically polled by the ADC logic. Setting the flag indicates the command queue has a pending conversion request. The conversion request specifies that an analog input value should be sampled from an analog input pin listed in the command queue. When the ADC control logic detects a conversion request (e.g., by detecting that a command queue has set its conversion request pending flag), the ADC control logic can identify (e.g., by reading the command queue's pointer) the analog input pin from which an analog input value is to be sampled.

The ADC control logic can also evaluate the command queue's priority. In the event that multiple command queues have conversion requests that are pending concurrently, the ADC control logic can select one of the conversion requests by selecting the command queue with the highest priority of those command queues with pending requests. Next, ADC control logic can initiate a sampling of an analog input value from an identified analog input pin listed in that command queue and an ADC can convert the analog input value to a digital value.

If an ADC system has multiple ADCs, ADC control logic can process multiple conversion requests simultaneously. For example, if the ADC system has two ADCs and at a given time four conversion requests are pending, the ADC control logic can process the two conversion requests from the two command queues having the highest priority of those command queues having pending conversion requests. This causes two analog input values to be sampled from two analog input pins (one analog input pin from each command queue) and converted simultaneously.

In the ADC system of FIG. 2, the priority of each analog input pin listed in a command queue's list of analog input pins is the same, i.e., the priority assigned to the command queue is assigned to each analog input pin listed in the command queue, in order to simplify the ADC control logic. This means the control logic can keep track of the priority of each command queue, and need not keep track of a priority for each analog input pin. Since an ADC system generally includes significantly fewer command queues than analog input pins, it is simpler to keep track of priority on the basis of command queues rather than analog input pins.

However, such a system is inflexible and can lead to inefficient utilization of ADC resources. For example, consider an analog input pin that is low priority during one period of time, and high priority during a second period of time. Such an example could arise in the case of an analog input pin coupled to a knock sensor. For the majority of an engine cycle, knock is unlikely, and the analog input pin on which the knock sensor values are available can be assigned a low priority. However during the relatively short period of the engine cycle when the engine is nearing combustion, the knock sensor values are a higher priority, and must be sampled and converted relatively quickly. In this example, if the knock sensor values are available on an analog input pin that is listed in a lower priority command queue, the knock sensor values may not be sampled and converted in a timely manner, and important knock sensor values may not be captured. On the other hand, if the analog input pin that receives the knock sensor value is placed in a higher priority queue, the knock sensor values may be prioritized (sampled and converted) ahead of other analog input pins during the periods of time when the knock sensor value is of little interest. During these periods it is desirable to prioritize the analog input pin on which knock sensor values are available below other analog input pins.

However, the ADC system of FIG. 2 does not provide such flexibility. Instead, in the ADC system of FIG. 2, one must either include the analog input pin on which the knock signal is available in a low priority command queue and risk losing important knock sensor values, include the analog input pin on which the knock signal is available in a high priority queue and risk sampling the knock sensor values ahead of other analog input values during a time when the knock sensor values are relatively unimportant, or include the analog input pin on which the knock signal is available in multiple queues. The disadvantages of including an analog input pin in multiple queues have already been discussed.

Yet another problem with the ADC system of FIG. 2 arises in connection with latency. Latency refers to the delay between the time that conversion of an analog input value is requested (e.g., in response to the occurrence of a trigger) and the time that the analog input value is sampled and converted.

The latency of an ADC system is an important characteristic of the ADC system. Generally latency is considered undesirable in an ADC system. Latency can limit the performance of a control system, e.g., an engine control system that encompasses the ADC system. Increased latency can cause jitter and lead to errors in the control system. Designers generally expend significant efforts to minimize latency. There are several ways to do so. One way to reduce latency, for example, is to use faster ADCs. Faster ADCs can convert more values in less time. However, faster ADCs are generally more expensive and bigger. Another way to decrease latency is to add one or more additional ADCs to the ADC system. This also is more expensive and requires more space. The space available for control system components is generally limited. For example, in an automobile engine control system, engine control system components are often crowded into small spaces in an engine compartment or behind the dashboard of a car. Accordingly, it is desirable to minimize the space required for control system components.

Many ADC systems, such as ADC system 150 of FIG. 2, include multiple ADCs to convert analog input values from the system's analog input pins to digital values. Each ADC converts values from a subset of the ADC system's analog input pins. For example, if an ADC system includes 100 analog input pins and two ADCs, a first ADC may be assigned the first 50 analog input pins of the 100 analog input pins and a second ADC may be assigned the second 50 analog input pins of the 100 analog input pins. In this example, when an analog value sampled from an analog input pin in the first 50 analog input pins needs to be converted to a digital value, the first ADC performs the conversion. Similarly, when an analog value sampled from an analog input pin in the second 50 analog input pins needs to be converted to a digital value, the second ADC performs the conversion.

Assigning analog input signals to particular ADCs is generally more involved than an arbitrary division such as that described above. When assigning analog input signals to ADCs, designers carefully consider factors such as the frequency with which each analog input signal will need to be converted and the priority of each analog input pin. In order to optimize ADC system performance and minimize the effects of latency, it is desirable to have the total number of conversions performed by the ADC system roughly evenly divided among each of the system's ADCs. Otherwise, if one of the ADCs is busier than the others, e.g., one ADC is performing significantly more conversions than the other ADCs, the busy ADC may introduce increased latency as a result of being unable to convert analog values as quickly as needed.

In the case where the other ADCs in the system are less busy (have fewer conversions to perform) sharing the load between the ADCs can be an effective way to reduce latency. In order to balance the conversion load between an ADC system's ADCs, designers can spend significant effort and care when designing the system to attempt to insure that each ADC processes approximately the same number of conversions. That is, if the system requires 50 conversions per second, the system designers can attempt to insure that approximately 25 go to each ADC (assuming that in this example the ADC system includes two ADCs).

Designers can attempt to predict which analog input signals are likely to be more active (require more conversions) and assign those analog input signals among the system's ADCs in such a manner that each ADC has some of the more active signals and some of the less active signals. All of an ADC system's analog input pins can be divided and assigned among the ADC system's ADCs in this way to attempt to ensure a balanced conversion load between the ADCs. This design process can be difficult for a number of reasons.

One factor that contributes to the difficulty of balancing a conversion load across all of an ADC system's ADCs is that the bandwidth requirements (number of conversions needed) for a given analog input signal can change over time. For example, in a first period of time, one of the analog input signals assigned to an ADC might be active, requiring frequent sampling and conversion and so demanding most of the ADCs resources. During this time period, other analog input signals, which may have lower priority, assigned to the ADC may experience increased latency. That is, the wait time between when a sample and conversion operation is requested for one of these lower priority analog input signals and when an analog input value is actually sampled and converted to a digital value may increase. As noted, increasing this wait time for analog input signals can have negative effects on the rest of the system (e.g., errors due to jitter).

During a second period of time, an analog input signal that was active during the first time period might be much less active. As a result, any latency problems other (e.g., lower priority) analog input signals experienced during the first time period (e.g., as a result of an ADC's resources being "hogged" by an active higher priority analog input signal) may not be an issue during the second time period. It can be difficult to accurately predict how much bandwidth will be needed by each analog input signal under all circumstances. Accordingly, load balancing between an ADC system's ADCs by assigning analog input signals to each ADC can be a difficult task. Ultimately, designers may be unable to assign analog input signals to ADCs such that problems due to latency are completely avoided.

Another problem with developing a scheme for assigning an ADC system's analog input signals to the ADC system's ADCs is that if designers wish to increase ADC bandwidth by adding additional ADCs, the entire load balancing design process must be undertaken again to attempt to predict which analog input signals will be most active and balance the load across the new number of ADCs accordingly. Thus, having an ADC system's analog input signals assigned to particular ones of the ADC system's ADCs introduces inflexibility into the system in that modifying or expanding the system requires significant redesign of the analog input signal assignment scheme.

Another concern related to latency can arise as a result of having a single sample and hold module shared by multiple analog input pins. As illustrated, ADC system 150 of FIG. 2 includes two multiplexers 220, two sample modules 240, and two ADCs 250. ADC system 150 includes one sample module for each ADC. As noted above, a particular group of analog input pins is assigned to each of the ADCs 250. In some cases, samples may need to be read from multiple analog input pins concurrently. That is, a trigger can occur that initiates sampling of a first analog input value from a first analog input pin. Before the ADC system has had a chance to complete sampling and conversion of the first analog input value, a second trigger can occur that initiates sampling of a second analog input value from a second analog input pin. In this case, an analog input value needs to be sampled from each of two analog input pins. If the two analog input pins are both assigned to a single ADC 250, ADC control logic 230 must delay one of the sample operations since ADC system 150 includes only one sample module for each ADC.

Delaying one of the sample operations incurs latency, and can introduce jitter and errors into the ADC system. In one case, by the time an analog input value is sampled from the second analog input pin (after the delay caused by sampling the first analog input value from the first analog input pin and converting the first analog input value to a digital value), the analog input value on the second analog input pin has changed since the time when the second trigger occurred.

Figure 5:
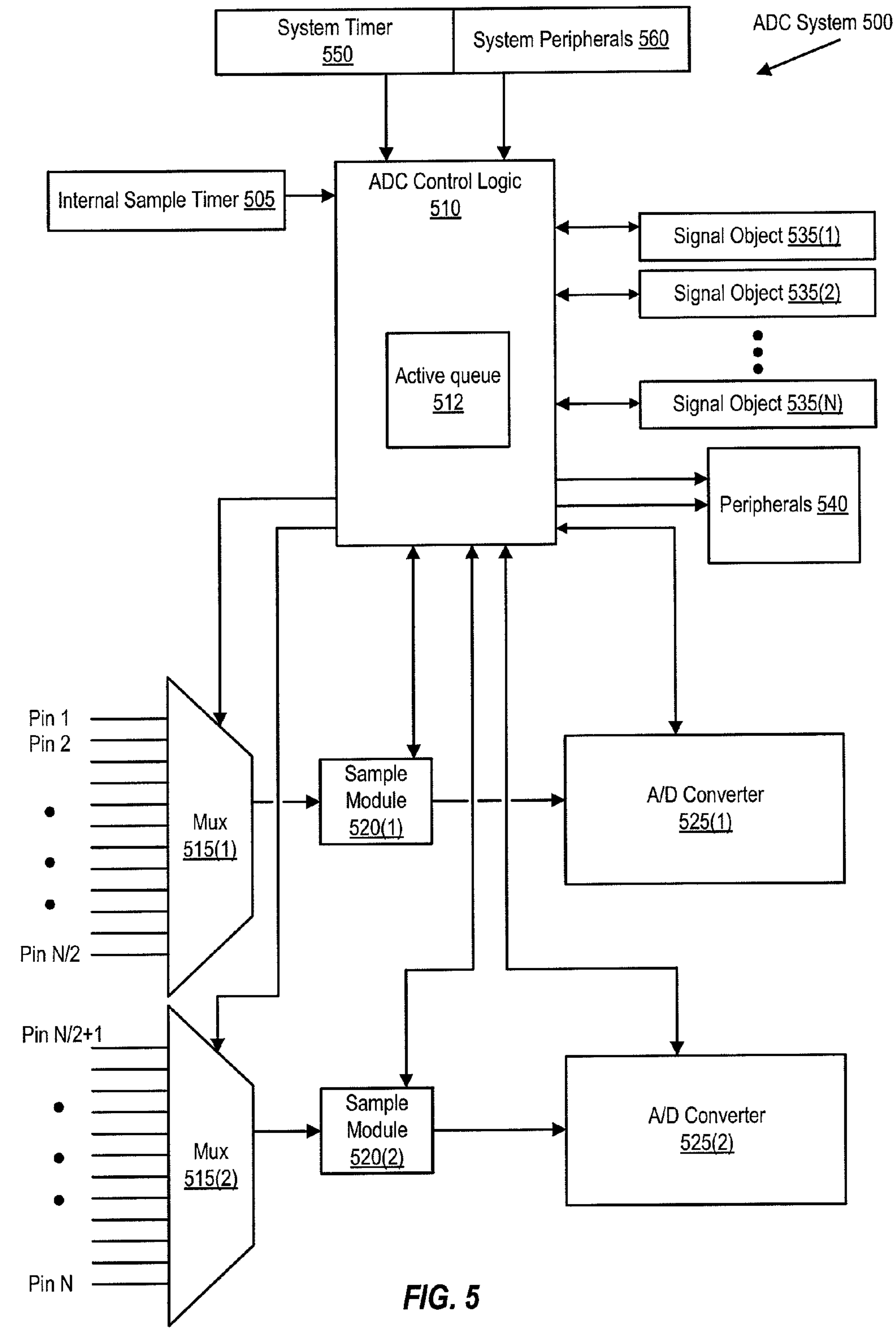
FIG. 5 is a block diagram that illustrates relevant components of an example ADC system, according to one embodiment.

This may result in suboptimal performance of engine control system 110 (which includes ADC system 150). That is, the second analog input value sampled may not accurately reflect the engine's operating conditions at the time that the second trigger occurred, and so the engine control system may not effectively control the engine. Unfortunately, in an ADC system, with only one sample module for each ADC, such a possibility is unavoidable FIG. 5 is a block diagram that illustrates relevant components of an example ADC system 500, according to one embodiment. As shown, ADC system 500 includes multiplexers 515. The inputs 1 through N of multiplexers 515 can be coupled to analog input pins that are in turn coupled to analog input sources. For example, an analog input pin can be coupled to a sensor that measures engine performance characteristics, such as an oxygen sensor (not shown). Thus, analog input values (e.g., a sensor's output values) are present on the inputs of multiplexers 515.

The outputs of multiplexers 515 are shown coupled to sample modules 520, which are shown coupled to ADCs 525. ADC system 500 is shown with two multiplexers, sample modules, and ADCs. In other embodiments, ADC system 500 can include more or less than two multiplexers, sample modules, and ADCs. When ADC control logic 510, selects one of multiplexer 515's inputs, an analog input value present on that input is transmitted to a sample module 520 and then to an ADC 525. The ADC 525 converts the analog input value to a digital value that can be used by the engine control system to control an engine's operating characteristics. For each multiplexer 515, ADC control logic 510 can select which multiplexer input to select based on which analog input pin is listed next in an active queue 512 that corresponds to that multiplexer 515. That is, ADC control logic 510 can detect which analog input pin is listed in one of active queues 512, and then provide a control signal to the multiplexer 515 that corresponds to that active queue 512 such that an analog input value is passed from the listed analog input pin to sample module 520. ADC control logic 510 includes an active queue 512 for each of the ADC system's ADCs 525. ADC control logic is also coupled to peripherals 540, which can include, for example, direct memory access, timed input/output, and/or serial communications interfaces.

In the illustrated embodiment, ADC control logic 510 is coupled to multiple signal objects 535(1)-535(N). A signal object can include a group of configuration, status, and result registers and buffers stored in memory that specifies the characteristics of an analog to digital (A/D) conversion operation, and stores the results data. ADC control logic 510 can use information in signal objects 535 to determine which analog input value to convert (which input of multiplexer 515 to select) and at what time to do so.

Figure 6A:
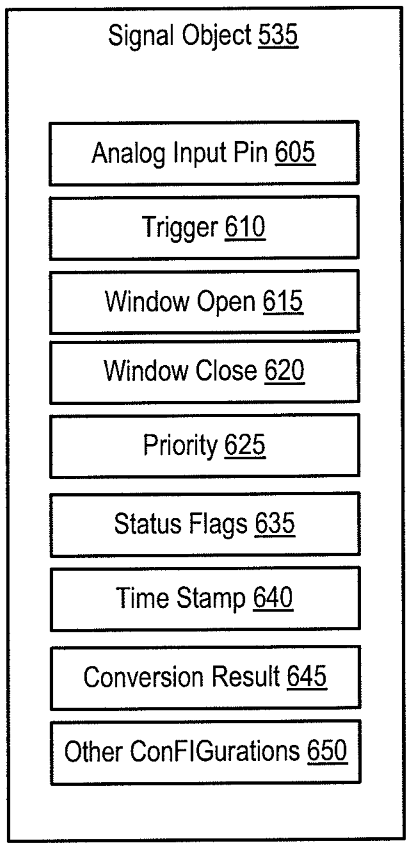
FIG. 6A illustrates relevant components of an example signal object, according to one embodiment.

FIG. 6A is a more detailed view of relevant components of an example signal object, such as signal object 535 of FIG. 5, including various pieces of information that can be stored in the signal object's registers or alternatively in RAM memory. Signal object 535, as shown, includes an analog input pin register 605, a sample trigger register 610, a window open register 615, a window close register 620, a priority register 625, a status flag(s) register 635, a time stamp register 640, a conversion result buffer 645, and an other configurations register 650.

Figure 6B:
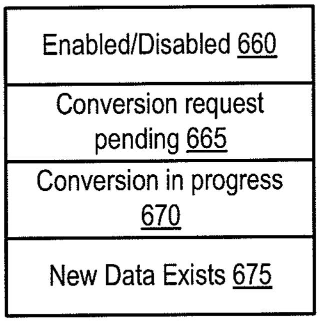
FIG. 6B illustrates relevant components of an example status flags register, according to one embodiment.

FIG. 6B is a detailed illustration of relevant components of an example status flags register, such as status flags register 635 of FIG. 6A. FIG. 6B shows an enabled/disabled flag 660, a conversion request pending flag 665, a conversion in progress flag 670, and a new data exists flag 675. These flags are used by an ADC system, such as ADC system 500, to sample and convert analog input values.

There can be one or more signal objects associated with each analog input signal in an engine control system. A signal object associated with a particular analog input signal can provide conversion parameters for that signal. For example, if an engine's knock sensor is coupled to an analog input pin that is coupled to pin 1 of an ADC system's multiplexer, a signal object associated with the knock signal can identify pin 1 as the analog input pin on which the knock signal is available. Signal object 535 of FIG. 6 can store information in analog input pin register 605 that can be used to identify the analog input pin.

In order to know when to sample an analog input value, ADC control logic can access a signal object's trigger register, such as trigger register 610 of FIG. 6A. The trigger register can specify that the occurrence of a particular condition should serve as the trigger for the ADC control logic to initiate a sample of the analog input pin specified by the signal object. For example, a signal object's trigger register can specify a certain value of a timer (e.g., internal sample timer 505 of FIG. 5) as the trigger. When the timer reaches the given value, ADC control logic can initiate sampling an analog input value from the analog input pin specified by the signal object. The trigger can also be the occurrence of some event, such as an external timer (e.g., system timer 550 of FIG. 5) reaching a certain value, or some event associated with a system peripheral (e.g., one of system peripherals 560 of FIG. 5).

The signal object illustrated in FIG. 6A also includes a window open register 615 and a window closed register 620. When a signal object's window has opened (and not yet closed) analog input values can be sampled in response to the signal object's trigger. The sampling window (the period between the occurrence of a window open event and the occurrence of a window closed event) defines a period in which sampling and conversion of the analog values present on an analog input pin are allowed to occur. Outside of a signal object's defined sampling window (e.g., before the window opens or after the window closes), the signal object will not initiate sampling and conversion, even when the signal object's trigger occurs. The sample window opens and closes based on conditions identified in the window open and close registers of the sample object. Similar to a trigger, the window opening and closing can be based on, for example, a timer (either internal or external) in the time, angle, or analog domain, or an external peripheral. For example, a sample window can be based on angle domain events (e.g., a sample window opens when engine angle is 0 degrees and closes 360 degrees of engine rotation later). When a sample window opens, the signal object can indicate that the signal object is enabled, e.g., by setting a signal object enabled flag, such as the enabled/disabled flag 660 of FIG. 6B. When a sample window closes, the signal object can clear the signal object enabled flag. The signal object enabled flag can be set and cleared for other reasons as well. For example, a signal object can be disabled during debug or testing of the engine control system.

When a signal object's trigger occurs while sample window is open, the signal object is said to request conversion. That is, ADC control logic detects that an analog input value should be sampled from the analog input pin specified by the signal object and transmitted to an ADC to be converted to a digital value. A signal object can request conversion, for example, by setting a conversion request pending flag, such as conversion request pending flag 665 of FIG. 6B. The ADC control logic can detect if a signal object's conversion request pending flag is set. For example, ADC control logic can poll a status flags register, such as status flags register 635 of FIG. 6A. If ADC control logic detects a signal object's conversion request pending flag is set, the ADC determines that the signal object is requesting conversion.

Ideally, as soon as a signal object's trigger occurs and the signal object sets its conversion request pending flag, ADC control logic will detect the conversion request pending flag and will initiate sampling of an analog input value from the signal object's analog input pin. Then, ideally with no delay, the sampled analog input value is converted by an ADC. However, as discussed above, a signal object can request conversion at a time when all of an ADC system's ADCs are busy converting other analog input values. Also, in an ADC system with multiple signal objects, several signal objects can request conversion simultaneously. If there are more signal objects requesting conversion than the available number of ADCs in the ADC system, the ADC system needs some way of determining which signal object should be processed first.

An ADC is available if the ADC is not busy converting an analog input value to a digital value, including receiving the analog input value and storing the digital value. For example, if an ADC system has three ADCs, but one is busy converting an analog input value, the ADC system has two ADCs available. In this example, if three signal objects request conversion simultaneously, there are only enough ADCs available to convert analog input values from two of the three analog input pins and so the ADC control logic must determine which two of the three to process first.

Each signal object has an assigned priority stored in a priority register, such as priority 625 of FIG. 6A. ADC control logic can access a signal object's priority to help determine the order in which signal objects with conversion request pending flags set are processed. The ADC control logic maintains an active queue, such as active queue 512 of FIG. 5. When ADC control logic selects a signal object for processing, the ADC control logic can create a conversion request corresponding to that signal object and add the conversion request to the active queue. When a conversion request is processed by an ADC, ADC control logic can remove the conversion request from the active queue.

When ADC control logic detects that a signal object has a conversion request pending flag set, the ADC control logic can create a new conversion request and add the new conversion request to the active queue. The new pending conversion request can be added to the active queue's list such that pending conversion requests having higher priority than the new pending conversion request are processed before the new pending conversion request and pending conversion requests having lower priority than the new pending conversion requests will be processed after the new pending conversion request. For example, if the new pending conversion request has a higher priority than any other pending conversion request in the active queue's list, the new pending conversion request will be inserted at the top of the active queue's list and will be processed ahead of any other pending conversion requests in the active queue's list. Other pending conversion requests will be delayed until the highest priority pending conversion request is processed. After the highest priority conversion request is processed, the conversion request from the signal object having the next highest priority is processed, and so on, until all the pending conversion requests have been processed in order of highest priority to lowest priority.

In one embodiment, ADC control logic includes a starvation prevention mechanism to insure that lower priority conversion requests are processed. For example, ADC control logic can include a timer that keeps track of the amount of time conversion requests have been stored in an active queue. If the time a lower priority conversion request has been stored in an active queue exceeds a certain value, the lower priority conversion request can be processed ahead of higher priority conversion requests.

After an ADC samples an analog input value from an analog input pin and converts the analog input value to a digital value, the ADC can transmit the digital value to the ADC control logic. The ADC control logic can store the digital value in a signal object's result buffer, such as conversion result buffer 645 of FIG. 6A. ADC control logic stores the digital value in the result buffer of a signal object whose trigger initiated the sampling of the analog input value that was converted into the digital value. Each signal object includes or identifies a result buffer that stores the conversion results for the analog input signal the signal object specifies. This buffer is accessible to a consumer of the digital values, such as direct memory access (DMA), processing units, peripherals, and the like.

When conversion results are stored in a signal object's result buffer, the signal object can notify a consumer of the availability of the conversion results. The signal object can set a flag, such as the new data exists flag 675 of FIG. 6B, in the signal object's status flags register. Consumers of the conversion results can read the value in the status flags register. If the new data exists flag is set, the consumer can read the conversion results from the conversion result buffer. Consumers of the conversion results can periodically poll the new data exists flag. Alternatively, the signal object can send a notification signal to a consumer via ADC control logic identifying the signal object, indicating that the signal object's conversion result buffer has digital values stored therein, and providing an address in memory where the conversion result buffer is located.

In addition to the status flags discussed above, additional signal status flags can exist. For example, a signal object can include a conversion in progress flag, such as conversion in progress flag 670 of FIG. 6B. A signal object can set a conversion in progress flag after ADC control logic adds a signal object's conversion request to the ADC control logic's active queue. Alternatively, the signal object can set the conversion in progress once notified by ADC control logic that an analog input value has actually been sampled from the signal object's analog input and is being converted by an ADC. These flags can be read by consumers of a signal object's digital values to monitor the operation of a signal object in order to determine when or whether conversion results (digital values) are available.

At completion of a conversion operation, e.g., when ADC control logic transmits conversion results to a signal object's result buffer, a signal object can capture and store a contemporaneous time stamp. For example, a time domain timer can be used that is set to zero at some predefined moment (e.g., the start of an engine) and advances 1 tick for every 10 milliseconds. A signal object can store whatever value this timer reads (e.g., 150 ticks) upon completion of a conversion operation in the signal object's conversion complete time stamp register, such as time stamp register 640 of FIG. 6A, to indicate that the most recent conversion completed at 150 ticks (or 1.5 seconds). The signal object should be configurable to allow a variety of time stamp sources to be used. For example, an angle domain timer that advances 1 tick for every 6 degrees of engine rotation can be used. In this example, if a conversion operation completes at 150 ticks of the angle domain timer, the value 150 can be stored in the signal object's conversion complete time stamp register to indicate that the most recent conversion completed after 150 ticks (or 900 degrees of engine rotation).

As illustrated in FIG. 6A, signal object 535 can include other configurations. For example, a signal object can include a software trigger. A software trigger can involve receiving a message from one or more of various programs running in the engine control system. In another embodiment, a software trigger involves evaluating an algorithm included in a signal object. If the evaluation produces a specified result, the signal object can initiate a conversion operation, e.g., by setting a conversion request pending flag.

A signal object can also include conversion performance criteria that specify, for example, how often the signal object should initiate a conversion operation. If the signal object's trigger fails to occur as frequently as specified by the conversion performance criteria, the signal object can be configured to initiate a conversion operation without the signal object's trigger occurring. In another embodiment, the performance criteria can specify that the signal object should initiate sampling outside the signal object's sample window. In this way, the performance criteria can override or alter the conversion performance specified by the other elements of the signal object and insure, for example, a minimum sample rate.

A signal object's sample rate can be set, e.g., by a designer, to any value. Thus, each signal processed by an ADC system such as the ADC system of FIG. 5 can have a sample rate that is set to exactly the rate desired. Furthermore, if a signal's sample rate needs to be changed, a designer can simply reconfigure the signal object to specify a different sample rate. For example, a designer can change a signal object's trigger to a trigger that occurs more or less frequently. This change can be performed via a software programming change. Similarly, if additional analog input signals need to be sampled, designers can simply add an additional signal object. Thus, changing conversion parameters for an analog input signal is a simple software change, and does not require extensive rerouting or reconfiguration which can potentially affect other areas of the ADC system. In one embodiment, an ADC control system can change a signal object's sample rate on the fly, for example, in response to detecting changing engine conditions.

Each signal object applies to one analog input signal. Multiple signal objects can be applied to a single analog input pin. This is useful, for example, to decompose composite signals. When multiple signals (e.g., a coil current signal, a knock signal, and a misfire signal) are available on a single analog input pin, the ADC system can include a signal object for each of the analog input signals available on the analog input pin. Thus, multiple signal objects can exist that each specify the same analog input pin. But if the multiple signal objects specify different triggers, different analog input signals can be captured from the same analog input pin. As can be seen, there is not a one-to-one correlation between signal objects and analog input pins. In order to fully utilize all analog input pins, there must be at least as many signal objects as analog input pins. However, multiple signal objects can be used for a single analog input pin.

In one embodiment, a single analog input signal can be assigned multiple different priorities. In order to do so, multiple signal objects can be associated with the analog input signal. Each of the signal objects can have a different priority as well as different sample windows. Thus, at a first time, an analog input signal can have a first priority while having a different priority at a second time.

Figure 7:
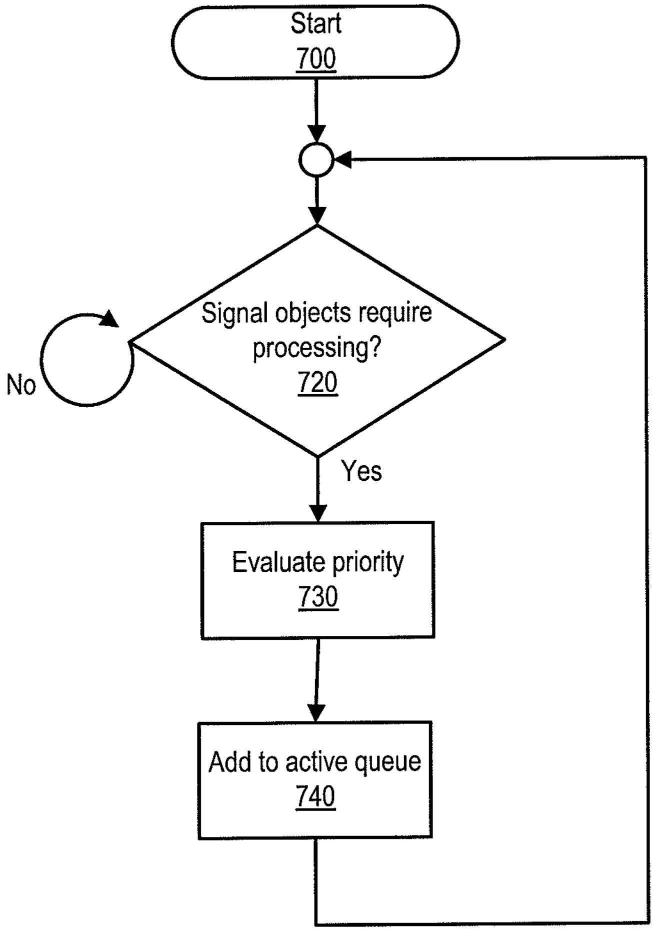
FIG. 7 is a flow diagram that illustrates relevant aspects of the operation of an ADC system, according to one embodiment.

FIG. 7 is a flow diagram showing relevant aspects of the operation of an ADC system that includes signal objects, according to one embodiment. The process illustrated by FIG. 7 begins at start operation 700. At decision operation 720, ADC control logic, such as ADC control logic 510 of FIG. 5, detects whether any of the ADC system's signal objects, such as signal objects 535 of ADC system 500 of FIG. 5, require processing. That is, ADC control logic detects whether a trigger has occurred such that an analog input value should be sampled from an analog input pin associated with any of the ADC system's signal objects. In order to detect the need to sample an analog input value, ADC control logic can, for example, read the status flags, such as status flags 635 of FIG. 6A, of some or all of the ADC system's signal objects. If a signal object has set a conversion request pending flag, such as conversion request pending flag 665 of FIG. 6B, the signal object is requesting conversion. Alternatively, a signal object can send a conversion request signal to ADC control logic. For example, a signal object can send a signal, such as an interrupt signal, to ADC control logic indicating that the signal object has a conversion request pending.

Once ADC control logic detects that a signal object is requesting conversion, ADC control logic can also detect whether the signal object is enabled. For example, ADC control logic can read the signal object's enabled/disabled flag, such as enabled/disabled flag 660 of FIG. 6B. The enabled flag can be set by the signal object upon the signal object's sample window opening and cleared by the signal object upon the signal object's sample window closing. If a signal object's conversion request pending flag and enabled flag are both set, the signal object needs processing. If no signal object requires processing ADC control logic waits, e.g., loops, until a conversion is requested.

Once ADC control logic detects a conversion request, i.e., once a signal object indicates to ADC control logic that an analog input value should be sampled from the analog input pin specified by the signal object and converted to a digital value, from an enabled signal object, ADC control logic evaluates the priority of the signal object that submitted the conversion request, at an evaluate priority operation 730. ADC control logic can evaluate a signal object's priority by, for example, accessing the signal object's priority register, such as priority register 625 of FIG. 6A. Alternatively, a signal object can transmit a priority indication to ADC control logic along with a conversion request. Based on the priority of the signal object that submitted the conversion request, ADC determines where in an active queue, such as active queue 512 of FIG. 5, to insert the conversion request.

In operation 740, ADC control logic inserts the conversion request into the active queue in the appropriate place. Once the conversion request is listed in the active queue, ADC control logic can update the signal object's flags, for example, by clearing the signal object's conversion request pending flag and setting the signal object's conversion request in progress flag. After ADC control logic inserts the conversion request into the active queue, the process returns to decision operation 720 to determine whether any additional conversion requests have been submitted.

Figure 8:
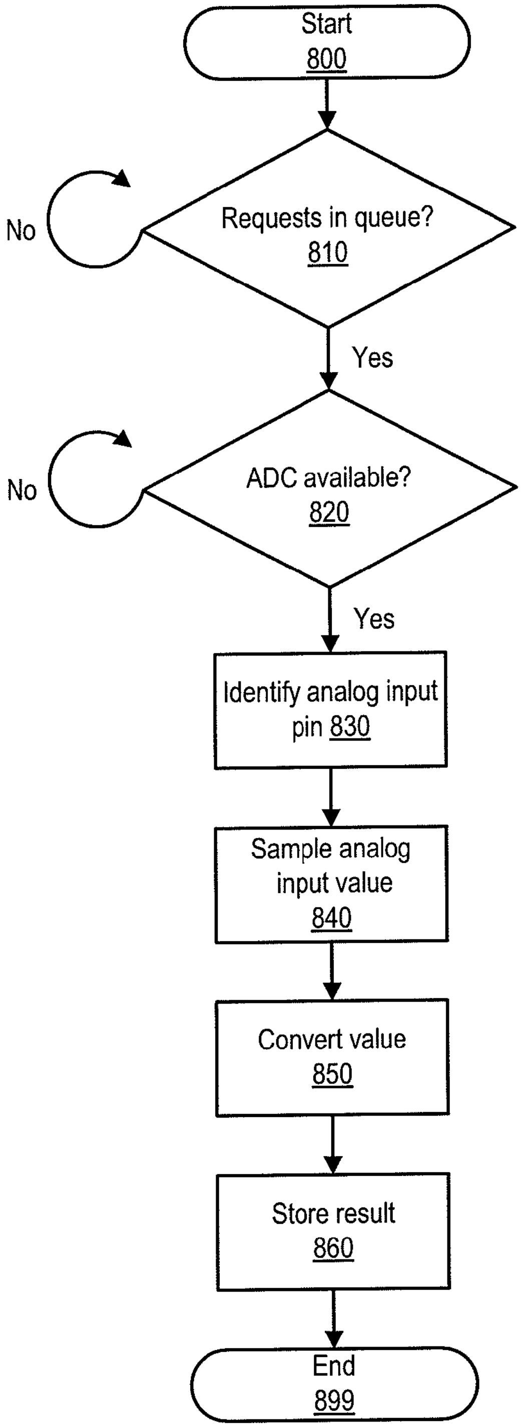
FIG. 8 is a flow diagram that illustrates further relevant aspects of the operation of an ADC system, according to one embodiment.

FIG. 8 is a flow diagram showing further relevant aspects of the operation of an ADC system, according to one embodiment. The process illustrated by FIG. 8 begins at start operation 800. Next, the process proceeds to decision operation 810 during which ADC control logic detects whether there are any pending conversion requests in any of the ADC system's active queue. That is, has a conversion request been submitted by a signal object and added by ADC control logic to an active queue. If not, the process illustrated by FIG. 8 loops until a conversion request is pending, e.g., added to an active queue.

When a conversion request is pending, ADC control logic then detects, in decision operation 820, whether an ADC, such as an ADC 525 of FIG. 5, is available to convert an analog input value to a digital value. If, for example, all of the ADC system's ADCs are busy converting other analog input values, the process illustrated by FIG. 8 loops until an ADC becomes available. Once an ADC becomes available, the process illustrated by FIG. 8 proceeds to identify analog input pin operation 830. The identify analog input pin operation involves ADC control logic detecting which analog input pin corresponds to the first pending conversion request in the active queue. In order to do so, ADC control logic can access the signal object that initiated creation of the conversion request and detect which pin the signal object identifies. Alternatively, the conversion request stored in the active queue can include information identifying the analog input pin identified by the signal object associated with the conversion request.

Next, the process illustrated by FIG. 8 proceeds to sample analog input value operation 840. In the sample analog input value operation, ADC control logic can detect which input pin of a multiplexer, such as multiplexer 515 of FIG. 5, corresponds to the identified analog input pin. ADC control logic can send a control signal to the multiplexer to transmit an analog input value from that input pin of the multiplexer to a sample module, such as sample module 520 of FIG. 5, that corresponds to the ADC that is to convert the analog input value.

In convert value operation 850, an ADC reads the analog input value stored in the corresponding sample module and converts the analog input value into a digital value. Next, in store result operation 860, the ADC stores the digital value in the signal object's result buffer, such as conversion result buffer 645 of FIG. 6A. ADC control logic can detect that the digital value is stored and update the signal object's flags accordingly, for example by setting a new data exists flag, such as new data exists flag 675 of FIG. 6B, and clearing a conversion in progress flag, such as conversion in progress flag 670 of FIG. 6B. The process illustrated by FIG. 8 ends at end operation 899.

Figure 9:
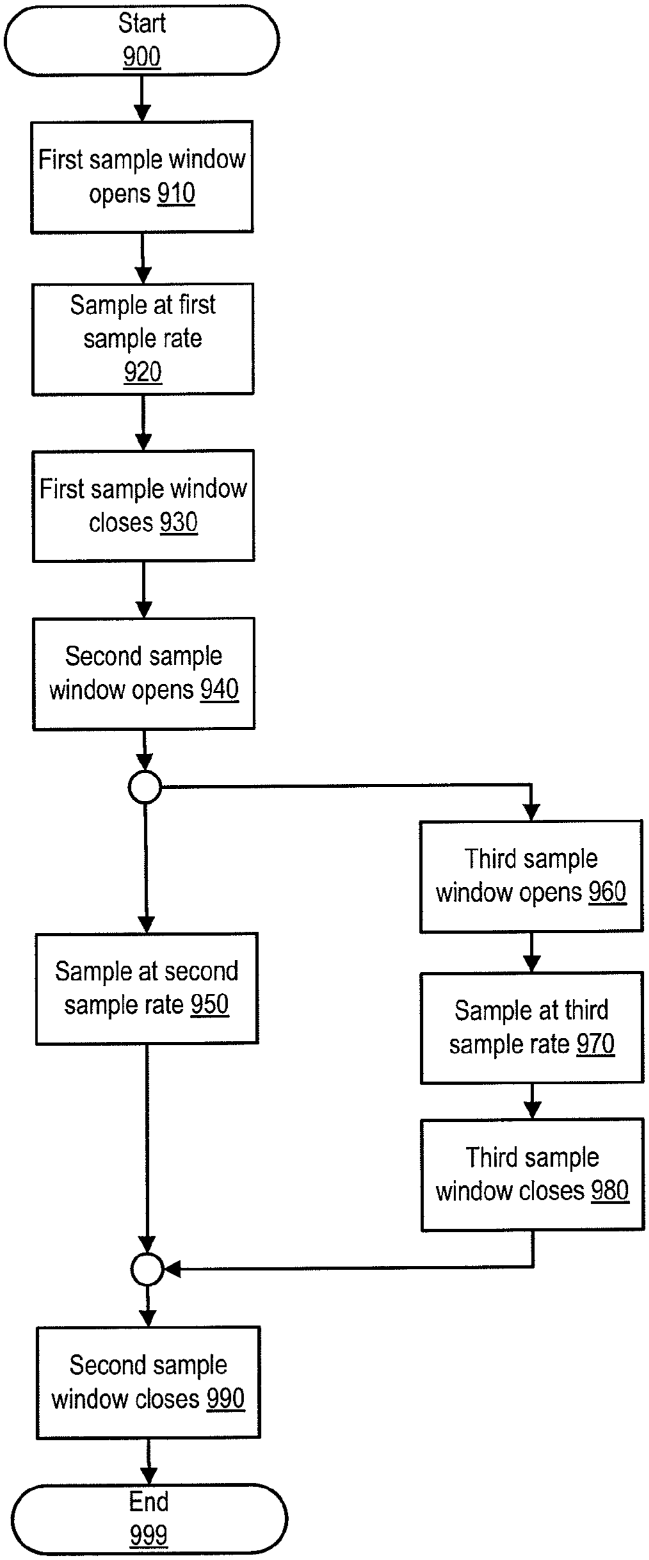
FIG. 9 is a flow diagram that illustrates relevant aspects of decomposing a composite signal, according to one embodiment.

FIG. 9 is a flow diagram that illustrates further relevant aspects of the operation of an ADC system, according to one embodiment. FIG. 9 is described with reference to an example composite signal, such as the composite signal shown in FIG. 4. The process illustrated by FIG. 9 begins at start operation 900. At first window opens operation 910, ADC control logic detects that a signal object's sample window opens. The sample window can open, for example, as a result of a timer reaching a specified value. In another embodiment, ADC control logic receives a signal specified in the signal object that signifies that the signal object's sample window is open. The signal object's enable flag can be set in response to the sample window opening. If the signal object's trigger occurs while the signal object's window is open, ADC control logic will sample the signal object's analog input pin. In this example, the occurrence of the window event can coincide with point A in FIG. 4.

Subsequent to the first sample window opening, ADC control logic detects the occurrence of the signal object's trigger and initiates sampling analog input values from the analog input pin associated with the signal object at a first sample rate at operation 920. The first sample rate is based on the frequency of occurrence of the signal object's trigger. The sampled analog input values are converted to digital values by an ADC and stored in the signal object's result buffer. In the example of FIG. 4, these digital values are coil current signal results, or coil current data. Subsequent to the first sample window opening, ADC control logic detects that the first sample window closes at first sample window closes operation 930. In the example of FIG. 4, this corresponds to the coil current window closing at point B.

Next, FIG. 9 illustrates second sample window opens operation 940. The ADC control logic detects that a sample window associated with a second signal object opens. In the example of FIG. 4, this corresponds to a misfire window opening at point C. Operation 950 illustrates sampling at a second sample rate. The second sample rate is based on the frequency of occurrence of the second signal object's trigger. The analog input values sampled from the analog input pin during the second sample window in response to the occurrence of the second signal object's trigger are converted to digital values by an ADC and stored in the second signal object's result buffer. In the example of FIG. 4, these digital values are misfire signal results, or misfire data.

At some time after the second sample window opens, while the analog input pin is being sampled at a second rate, ADC control logic detects the opening of a third sample window associated with a third signal object at third sample window opens operation 960. The third sample window opening corresponds to point D in the example of FIG. 4, where the knock window opens. Operation 970 illustrates sampling at a third sample rate. The third sample rate is based on the frequency of occurrence of a trigger associated with the third signal object. The sampled analog input values are converted to digital values by an ADC and stored in the third signal object's result buffer. In the example of FIG. 4, these digital values are knock signal results, or knock data. At operation 980, ADC control logic detects the third sample window closing. The third sample window closing corresponds to point E in the example of FIG. 4, or the closing of the knock window.

The process illustrated by FIG. 9 then proceeds to second sample window closes operation 990. The ADC detects the second sample window closing at a point that corresponds to point F in the example of FIG. 4, or the closing of the misfire window.

While the knock and misfire window are open concurrently, both the misfire signal object and the knock signal object cause sampling of the analog input pin on which the composite signal of FIG. 4 is available. In this way, the signal object is sampled at a rate that is appropriate to detect misfire and another rate appropriate to detect knock. The digital values that represent misfire data are stored in the misfire signal object's result buffer and the digital values that represent knock data are stored in the knock signal object's result buffer. An engine control system can access these results without needing to parse the results. The engine control system can access these results via DMA or a processor. Separating the multiple source signals thus decomposes the composite signal of FIG. 4. The process illustrated by FIG. 9 ends at end operation 999.

While FIG. 9 (and FIG. 4) are shown in the context of a composite object having 3 separate source signals, the present invention is not limited to any particular number of source signals in a single composite signal. To the contrary, any number of source signals can be included in a single composite signal. Similarly, any number of signal objects having any number of sample windows can be employed to affect the sampling of analog input values from a given analog input signal.

Figure 10:
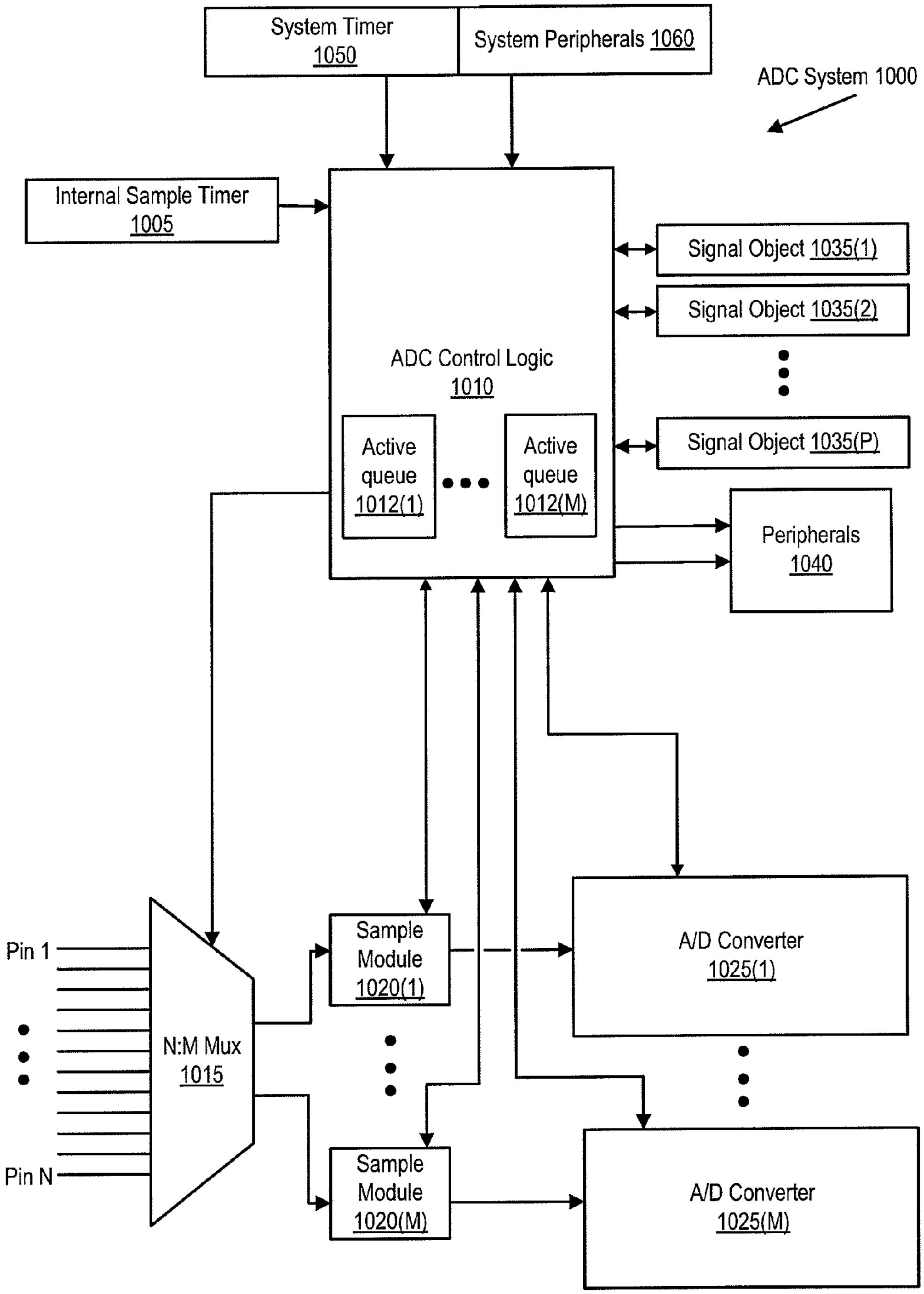
FIG. 10 is a block diagram that illustrates relevant components of an example ADC system, according to one embodiment.

FIG. 10 is a block diagram that illustrates relevant components of an example ADC system 1000, according to one embodiment. As shown, ADC system 1000 of FIG. 10 includes multiplexer 1015. The inputs 1 through N of multiplexer 1015 can be coupled to analog input pins that are in turn coupled to analog input sources (not shown). For example, an analog input pin can be coupled to a sensor that measures engine performance characteristics, such as an oxygen sensor. Thus, analog input values (e.g., a sensor's output values) are present on the inputs of multiplexer 1015.

Multiplexer 1015 is a multiple input/multiple output multiplexer. That is, multiplexer 1015 can pass analog input values from multiple input pins to multiple output pins. Multiplexer 1015 is shown as having N possible inputs and M possible outputs. N corresponds to the number of analog input pins, and M corresponds to the number of sample modules and ADCs included in ADC system 1000. Generally, N is greater than M. The outputs of multiplexer 1015 are shown coupled to sample modules 1020(1)-1020(M), which are shown coupled to ADCs 1025(1)-1025(M). As shown, ADC system 1000 includes ADC control logic 1010. When ADC control logic 1010, selects one of multiplexer 1015's inputs, an analog input value present on the selected input is transmitted to one of sample modules 1020(1)-1020(M) and then to one of ADCs 1025(1)-1025(M). The ADC 1025 converts the analog input value to a digital value that can be used by an engine control system, such as engine control system 100 of FIG. 1, to control an engine's operating characteristics. ADC control logic 1010 selects which multiplexer inputs to select based on which analog input pins are listed in active queues 1012(1)-(M), which are shown included in ADC control logic 1010. ADC control logic 1010 can include an active queue 1012 for each of the ADC system's ADCs 1025.

In the illustrated embodiment, ADC control logic 1010 is coupled to multiple signal objects 1035(1)-1035(P). ADC control logic 1010 is also shown coupled to internal sample timer 1005, external timer 1050, external peripherals 1060, and peripherals 1040.

FIG. 10 has all inputs multiplexed across all ADCs. Thus when a signal object submits a conversion request, ADC control logic must determine which ADC to assign the conversion request. This is done each time a signal object requests conversion since the signal object's analog input pins are not fixedly assigned at some initial time to a specific ADC. This is done dynamically based on the utilization of the ADC system's ADCs.

For example, ADC control logic can monitor the number of pending conversion requests for each ADC of ADC system 1000 by monitoring active queue 1012. Doing can help reduce latency in the ADC system. Conversion requests are allocated from the head of active queue 1012 to all sample modules and ADCs in the ADC system. ADC control logic can evaluate certain factors in determining which of the ADC system's ADCs should convert a given analog input value. For example, ADC control logic can detect whether some of the ADCs convert analog input values to digital values faster than others, e.g., as a result of being newer or more advanced technology.

Figure 11:
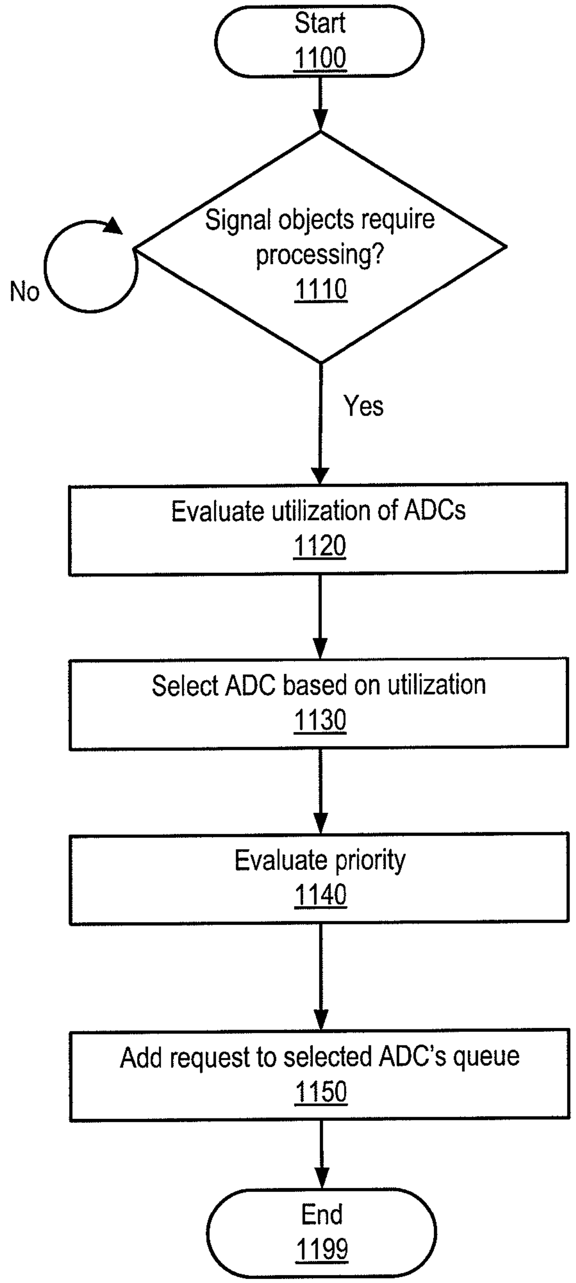
FIG. 11 is a flow diagram that illustrates relevant aspects of the operation of an ADC system, according to one embodiment.

FIG. 11 is a flow diagram that illustrates relevant aspects of the operation of an ADC system, according to one embodiment. FIG. 11 begins at a start operation 1100. At decision operation 1110, ADC control logic, such as ADC control logic 1010 of FIG. 10, detects whether any signal objects, such as one of signal objects 1035 of FIG. 10, require processing. That is, ADC control logic detects whether a trigger has occurred such that an analog input value should be sampled from an analog input pin associated with any of the ADC system's signal objects. In order to detect the need to sample an analog input value, ADC control logic can, for example, read the status flags, such as status flags 635 of FIG. 6A, of some or all of the ADC system's signal objects. If a signal object has set a conversion request pending flag, such as conversion request pending flag 665 of FIG. 6B, the signal object is requesting conversion. Alternatively, a signal object can send a conversion request signal to ADC control logic. For example, a signal object can send a signal, such as an interrupt signal, to ADC control logic indicating that the signal object has a conversion request pending.

Once ADC control logic detects that a signal object is requesting conversion, ADC control logic can also detect whether the signal object is enabled. For example, ADC control logic can read the signal object's enabled/disabled flag, such as enabled/disabled flag 660 of FIG. 6B. The enabled flag can be set by the signal object upon the signal object's sample window opening and cleared by the signal object upon the signal object's sample window closing. If a signal object's conversion request pending flag and enabled flag are both set, the signal object needs processing. If no signal object requires processing ADC control logic waits, e.g., loops, until a conversion is requested.

Once ADC control logic detects a conversion request, i.e., once a signal object indicates to ADC control logic that an analog input value should be sampled from the analog input pin specified by the signal object and converted to a digital value, from an enabled signal object, ADC control logic must determine which ADC of the ADC system's ADCs should convert an analog input value corresponding to the conversion request. In order to determine which ADC should convert the analog input value, ADC control logic can evaluate utilization of the ADC system's ADCs at an evaluate utilization of ADCs operation 1120. In order to do so, ADC control logic can track the number of conversion operations performed and pending for each ADC in the ADC system. Based on the evaluation of ADC utilization statistics, ADC control logic can select one of the ADC system's ADCs to convert the analog input value that corresponds to the conversion request at a Select ADC based on utilization operation 1130.

At operation 1140, ADC control logic can evaluate a priority associated with the signal object that submitted the conversion request. ADC control logic can evaluate the priority of the signal object that submitted the conversion request, for example, accessing the signal object's priority register, such as priority register 625 of FIG. 6A. Alternatively, a signal object can transmit a priority indication to ADC control logic along with a conversion request. Based on the priority of the signal object that submitted the conversion request, ADC determines where in an active queue, such as active queue 1012 of FIG. 10, to insert the conversion request. ADC control logic can add the conversion request to the active queue at operation 1150. The process illustrated by FIG. 11 ends at end operation 1199.

Figure 12A:
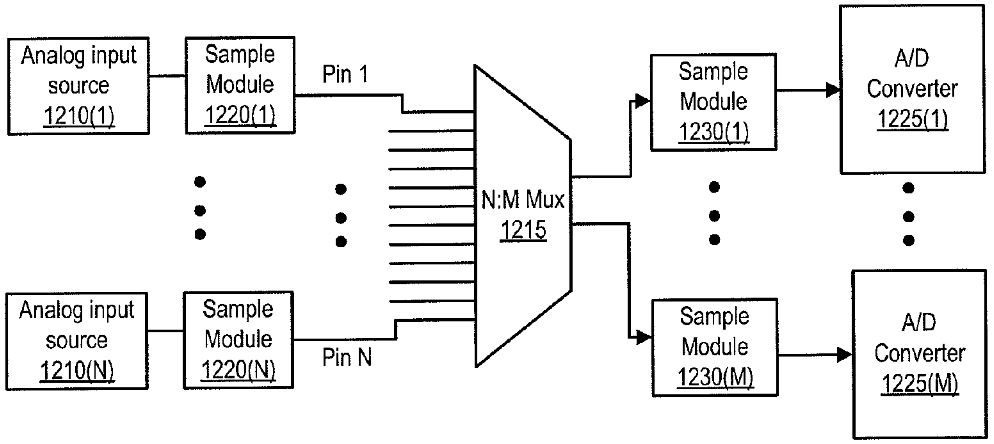
FIG. 12A is a block diagram that illustrates relevant components of an example ADC system, according to one embodiment.

FIG. 12A is a block diagram that illustrates relevant components of an example ADC system, according to one embodiment. As shown, FIG. 12A includes a sample module 1220 for each analog input pin. Each sample module 1220 is coupled to an analog input source 1210 and control logic, such as ADC control logic 1010 of FIG. 10. The control logic can indicate that the sample module 1220 should sample an analog input value from the analog input source 1210 to which the sample module 1220 is coupled. Multiplexer 1215 can receive one or more control signals indicating that an analog input value should be transmitted from a sample module 1220 to a sample module 1230 on the output of multiplexer 1215. The analog input value can be stored in the sample module 1230 until read and converted to a digital representation of the analog input value by one of ADCs 1225.

Figure 12B:
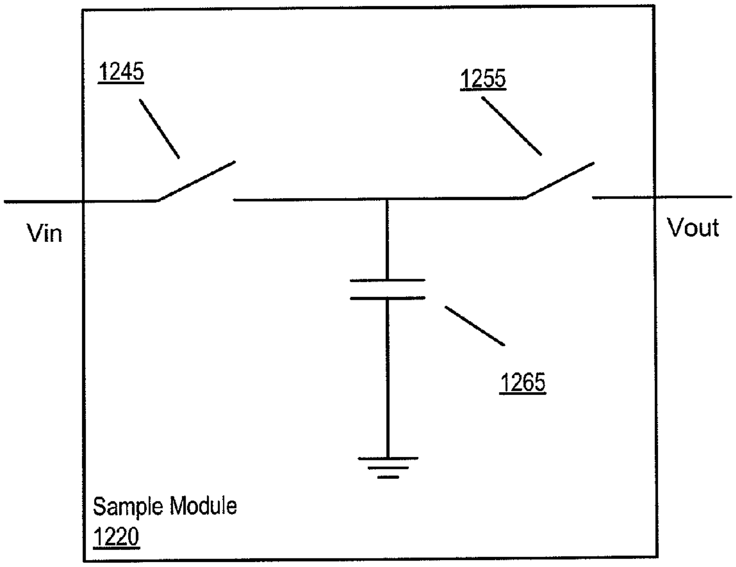
FIG. 12B is a block diagram that illustrates relevant components of an example sample and hold circuit, according to one embodiment.

FIG. 12B is a block diagram that illustrates relevant components of an example sample module, such as sample module 1220, according to one embodiment. As shown, the example sample module 1220 of FIG. 12B includes switches 1245 and 1255 and a capacitor 1265. Switch 1245 is coupled to Vin, which is coupled to an analog input source, such as analog input source 1210 of FIG. 12A. When switch 1245 is closed and switch 1255 is open, a voltage (which represents an analog input value) present at Vin can charge capacitor 1265. Switch 1245 can be closed, for example, in response to sample module 1220 receiving a control signal, for example a control signal sent by ADC control logic 1010 of FIG. 10.

If switch 1245 is opened after being charged to an analog input value transmitted by analog input source 1210, the analog input value is stored (held) in capacitor 1265. If, while switch 1245 is opened, switch 1255 is closed, the analog input value stored in capacitor 1265 is transmitted to Vout.

Figure 13A:
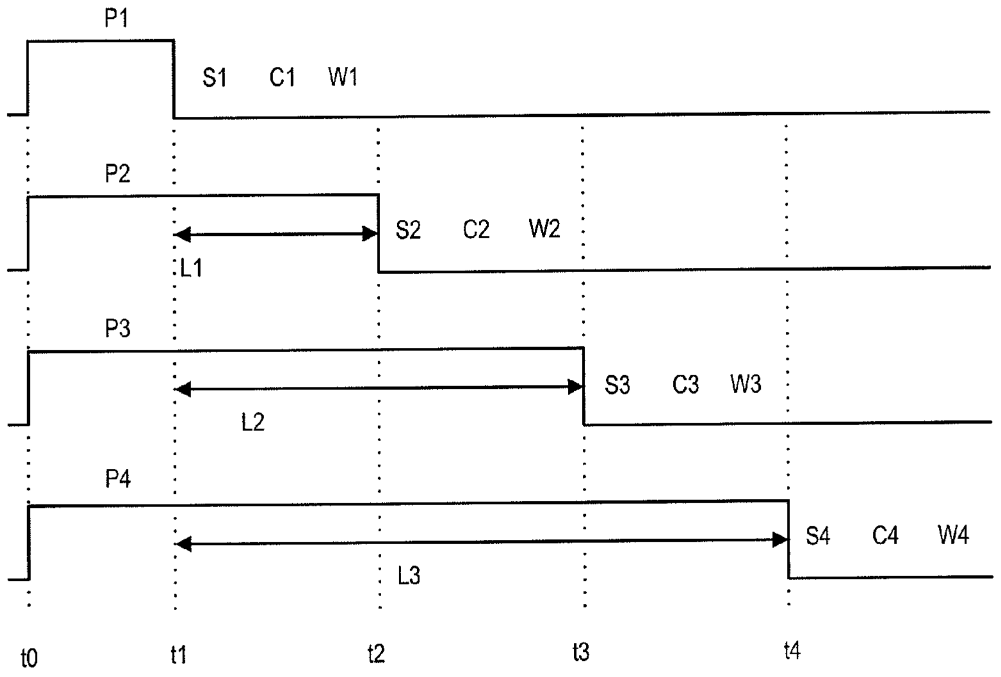
FIG. 13A is a timing diagram that illustrates relevant aspects of the operation of an ADC system, according to one embodiment.

FIG. 13A is a timing diagram that illustrates relevant aspects of the operation of an ADC system, according to one embodiment. FIG. 13A illustrates a sample and convert cycle for an ADC system such as ADC system 1010 of FIG. 10. FIG. 13A shows that at time t0, four conversion requests P1, P2, P3, and P4 are detected by ADC control logic. It will be assumed for the purpose of this example only that each of conversion requests P1-P4 corresponds to a separate analog input pin and that each of the four analog input pins is assigned to the same ADC. The conversion requests are detected, for example, as a result of triggers occurring in each of four signal objects. In one embodiment, when a trigger occurs that is identified in a given signal object, a conversion request pending flag in the signal object can be set.

Conversion request P1 is processed between time t1 and t2. That is, an analog input value is sampled at point S1 (e.g., by a sample module 1020 of FIG. 10), converted at point C1 (e.g., by an ADC 1025), and written at point W1 (e.g., to a signal object 1035's result buffer). At time t2, once conversion request P1 has been processed, conversion request P2 can be processed. Though conversion request P2 occurred at time t1, since the ADC and sample module to which P1 is assigned were busy processing conversion request P1 until time t2, conversion request P2 is delayed. L1 represents the delay between the time conversion request P1 occurred and the time the ADC system begins processing conversion request P1. This delay is the latency between occurrence and processing of conversion request P2. Since each of P1, P2, P3, and P4 must be processed by a single sample and hold circuit and ADC, only one conversion request can be processed at one time and the others must be delayed.

Conversion request P2 is processed between time t2 and t3. That is, an analog input value is sampled at point S2 (e.g., by a sample module 1020 of FIG. 10), converted at point C2 (e.g., by an ADC 1025), and written at point W2 (e.g., to a signal object 1035's result buffer).

Conversion request P3 is processed between time t3 and t4. That is, an analog input value is sampled at point S3 (e.g., by a sample module 1020 of FIG. 10), converted at point C3 (e.g., by an ADC 1025), and written at point W3 (e.g., to a signal object 1035's result buffer).

Conversion request P4 is processed after t4. That is, an analog input value is sampled at point S4 (e.g., by a sample module 1020 of FIG. 10), converted at point C4 (e.g., by an ADC 1025), and written at point W4 (e.g., to a signal object 1035's result buffer).

Figure 13B:
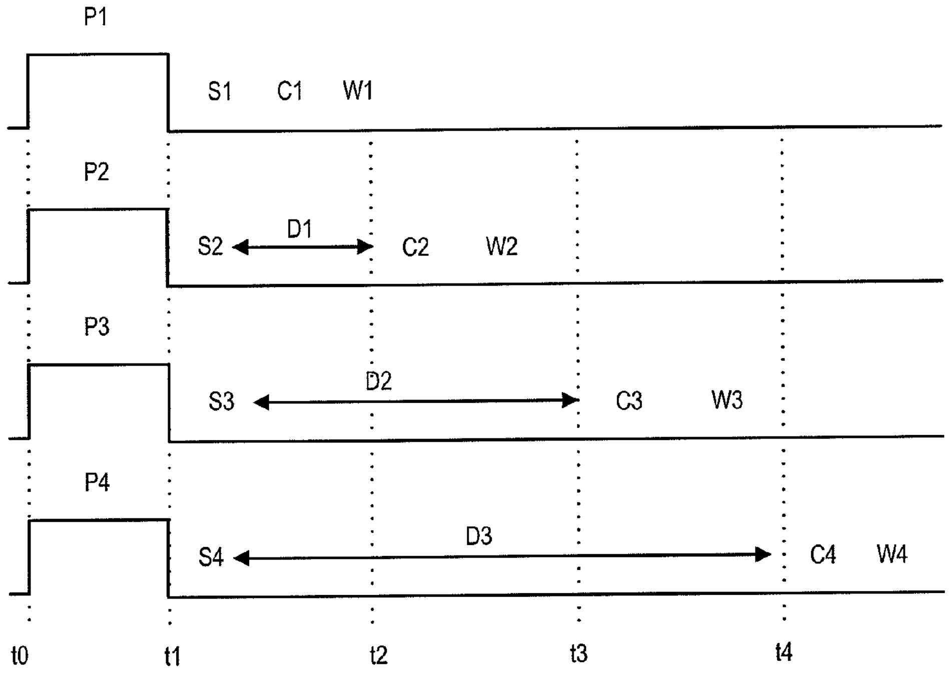
FIG. 13B is a timing diagram that illustrates relevant aspects of the operation of an ADC system, according to one embodiment.

FIG. 13B is a timing diagram that illustrates relevant aspects of the operation of an ADC system, according to one embodiment. FIG. 13B illustrates the operation of an ADC system that includes dedicated sample and hold circuits for each of the ADC system's analog input pins, as shown in FIG. 12A. FIG. 13B shows that at time t0, four conversion requests P1, P2, P3, and P4 are detected. It will be assumed for the purpose of this example only that each of conversion requests P1-P4 corresponds to a separate analog input pin and that each of the four analog input pins is assigned to the same ADC. The conversion requests are detected, for example, as a result of triggers occurring in each of four signal objects.

Each of the analog input pins that corresponds to the conversion requests P1-P4 is sampled at time t1. Conversion and write operations for P1 can proceed immediately following sampling P1. Conversion and write operations for P2 begin at t2, after a delay of D1. Conversion and write operations for P3 begin at t3, after a delay of D2. Conversion and write operations for P4 begin at t3, after a delay of D3.

Figure 14:
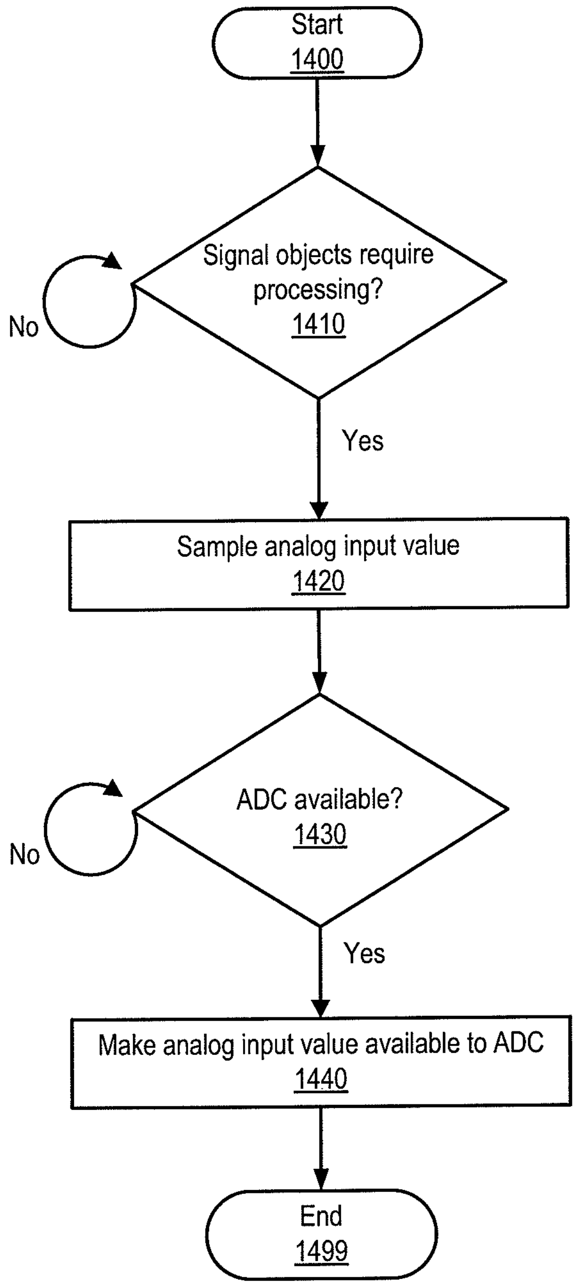
FIG. 14 is a flow diagram that illustrates relevant aspects of the operation of an ADC system, according to one embodiment.

FIG. 14 is a flow diagram that illustrates relevant aspects of the operation of an ADC system, according to one embodiment. The process illustrated by FIG. 14 starts at a start operation 1400. At operation 1410, ADC control logic, such as ADC control logic 1010 of FIG. 10 detects that a signal object requires processing. That is, ADC control logic detects that an analog input value should be sampled from an analog input pin associated with one of the ADC system's signal objects.

Once ADC control logic detects a signal object needs processing, the ADC control logic sends a control signal to a sample module, such as sample module 1220 of FIG. 12. When the sample module receives the control signal, the sample module can sample an analog input value at operation 1420. The sample module samples the analog input value from an analog input pin to which the sample module is coupled.

Next, at operation 1430, ADC control logic determines whether an ADC, such as ADC 1225 of FIG. 12, is available to convert the analog input value being held in the sample module. If no ADC is available, e.g., all the ADC system's ADCs are busy converting other analog input values, the process loops. Once an ADC is available, ADC control logic can send a control signal to the sample module. In response to receiving the control signal, the sample module can transmit, at operation 1440, the held analog input value to an ADC. In order to transmit the held value, the sample module can close a switch, such as switch 1255 of FIG. 12B, coupled to an output of the sample module. The output of the sample module, as shown in FIG. 12A, is coupled to an input pin of a multiplexer 1215.

As shown in FIG. 12A, the ADC system's sample modules are coupled to an ADC via a multiplexer and another sample module, such as one of sample modules 1230. In addition to each input of the multiplexer having a dedicated sample module, each ADC in the system has a sample module coupled to the ADC input. Concurrently with sending a signal to a sample module to transmit the held analog input value, the ADC control logic can send a control signal to the multiplexer such that the analog input value on the desired input pin of the multiplexer is transmitted to the ADC. The process illustrated by FIG. 14 ends at end operation 1499.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. A method comprising:

detecting a first event, wherein the first event is identified by a first signal object stored in memory, the first signal object is one of a plurality of signal objects, and each signal object respectively identifies one and only one signal; and sampling a first value from a first pin in response to the first event.

2. The method of claim 1, further comprising:

detecting a second event, wherein the second event is specified by a second signal object stored in memory; and sampling a second value from the first pin in response to the second event.

3. The method of claim 2, wherein:

the first event occurs at a first rate;

the second event occurs at a second rate; and the first rate is different from the second rate.

4. The method of claim 2, further comprising:

converting the first value to a first digital value;

storing the first digital value in a first register, wherein storing the first digital value comprises accessing the first signal object;

converting the second value to a second digital value; and storing the second digital value in a second register, wherein storing the second digital value comprises accessing the second signal object.

5. The method of claim 1, further comprising:

modifying the first signal object such that the first signal object specifies a modified first event, wherein the modified first event occurs at a rate different from a rate at which the first event occurs.

6. The method of claim 1, further comprising:

detecting a first priority associated with the first pin, wherein the detecting the first priority comprises accessing the first signal object.

7. The method of claim 6, further comprising:

detecting a second priority associated with the first pin, wherein the detecting the second priority comprises accessing a second signal object, and the second priority is different from the first priority.

8. The method of claim 1, further comprising:

receiving information about the first signal;

specifying a value for at least one parameter of a plurality of parameters included in the first signal object; and storing the first signal object in memory.

9. The method of claim 1, further comprising:

detecting whether a first sample window specified by the first signal object is open.

10. The method of claim 9, wherein sampling the first signal is enabled in response to detecting that the first sample window is open.

11. An apparatus comprising:

a control circuit configured to detect a first event;

a memory configured to store a plurality of signal objects, wherein each signal object respectively identifies one and only one signal, and the first event is identified by a first signal object of the plurality of signal objects; and a sampling circuit configured to sample a first value from a first pin of a plurality of pins in response to the first event.

12. The apparatus of claim 11, wherein the control circuit is further configured to detect a second event, wherein the second event is specified by a second signal object stored in memory; and the sample circuit is further configured to sample a second value from the first pin in response to the second event.

13. The apparatus of claim 12, wherein:

the first event occurs at a first rate;

the second event occurs at a second rate; and the first rate is different from the second rate.

14. The apparatus of claim 12, further comprising:

an analog-to-digital converter (ADC) configured to convert the first value to a first digital value and convert the second value to a second digital value, wherein the first signal object comprises a register configured to store the first digital value, and the second signal object comprises a register configured to store the second digital value.

15. The apparatus of claim 11, wherein the control circuit is configured to modify the first signal object such that the first signal object specifies a modified first event, wherein the modified first event occurs at a rate different from a rate at which the first event occurs.

16. The apparatus of claim 11, wherein the first signal object specifies a first priority associated with the first pin.

17. The apparatus of claim 16, wherein a second signal object specifies a second priority associated with the first pin, wherein the second priority is different from the first priority.

18. The apparatus of claim 11, wherein the control circuit is configured to receive information about the first signal, specify a value for at least one parameter of a plurality of parameters included in the first signal object, and store the first signal object in memory.

19. The apparatus of claim 11, wherein the control circuit is configured to detect whether a first sample window specified by the first signal object is open.

20. The apparatus of claim 19, wherein sampling the first signal is enabled in response to detecting that the first sample window is open.

* * * * *